United States Patent
Ishimatsu

(10) Patent No.: US 10,350,872 B2
(45) Date of Patent: Jul. 16, 2019

(54) METHOD FOR MANUFACTURING ANISOTROPICALLY CONDUCTIVE FILM, ANISOTROPICALLY CONDUCTIVE FILM, AND CONDUCTIVE STRUCTURE

(71) Applicant: DEXERIALS CORPORATION, Tokyo (JP)

(72) Inventor: Tomoyuki Ishimatsu, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 1107 days.

(21) Appl. No.: 14/416,473

(22) PCT Filed: Aug. 1, 2013

(86) PCT No.: PCT/JP2013/070892
§ 371 (c)(1),
(2) Date: Jan. 22, 2015

(87) PCT Pub. No.: WO2014/021424
PCT Pub. Date: Feb. 6, 2014

(65) Prior Publication Data
US 2015/0208511 A1    Jul. 23, 2015

(30) Foreign Application Priority Data

Aug. 1, 2012 (JP) ................. 2012-171331
Aug. 1, 2013 (JP) ................. 2013-160116
(Continued)

(51) Int. Cl.
*H05K 1/02* (2006.01)
*B32B 37/18* (2006.01)
(Continued)

(52) U.S. Cl.
CPC .............. *B32B 37/185* (2013.01); *B32B 3/30* (2013.01); *B32B 27/20* (2013.01); *B32B 37/025* (2013.01);
(Continued)

(58) Field of Classification Search
CPC ... H01L 2224/16238; H01L 2224/2711; H01L 2224/29082; H01L 2224/2929;
(Continued)

(56) References Cited

U.S. PATENT DOCUMENTS 8,008,582 B2 * 8/2011 Shimada .................. H01L 24/29
174/257
8,124,885 B2 * 2/2012 Yamada ............. H01R 12/7082
174/262
(Continued)

FOREIGN PATENT DOCUMENTS

JP    H09-320345 A    12/1997
JP    H10-104650 A    4/1998
(Continued)

OTHER PUBLICATIONS

Search Report issued in International Application No. PCT/JP2013/070892 dated Nov. 5, 2013.
(Continued)

*Primary Examiner* — Angel R Estrada
(74) *Attorney, Agent, or Firm* — Oliff PLC

(57) ABSTRACT

The present invention is to provide an anisotropic conductive film that excels in dispersing conductive particles and trapping the particles, and maintains conduction reliability even between narrow-pitched terminals. By a method for manufacturing an anisotropic conductive film containing conductive particles, the conductive particles are buried in grooves in a sheet having the grooves regularly formed in the same direction, the conductive particles are arranged, a
(Continued)

first resin film having a thermo-setting resin layer formed on a stretchable base film is laminated on the surface of the sheet on the side of the grooves to transfer and attach the conductive particles to the first resin film, the first resin film is uniaxially stretched in a direction other than the direction perpendicular to the array direction of the conductive particles, and a second resin film is laminated.

12 Claims, 15 Drawing Sheets

(30) Foreign Application Priority Data

Aug. 1, 2013 (JP) ................................. 2013-160117
Aug. 1, 2013 (JP) ................................. 2013-160118

(51) Int. Cl.

| | |
|---|---|
| *B32B 27/20* | (2006.01) |
| *B32B 3/30* | (2006.01) |
| *B32B 37/00* | (2006.01) |
| *B32B 37/24* | (2006.01) |
| *H01L 23/00* | (2006.01) |
| *H05K 3/32* | (2006.01) |
| *B32B 37/12* | (2006.01) |

(52) U.S. Cl.
CPC .............. *B32B 37/24* (2013.01); *H01L 24/27* (2013.01); *H01L 24/29* (2013.01); *H01L 24/32* (2013.01); *B32B 37/1207* (2013.01); *B32B 2037/1253* (2013.01); *B32B 2307/202* (2013.01); *B32B 2310/0831* (2013.01); *B32B 2457/00* (2013.01); *H01L 2224/16238* (2013.01); *H01L 2224/2711* (2013.01); *H01L 2224/2929* (2013.01); *H01L 2224/2939* (2013.01); *H01L 2224/29082* (2013.01); *H01L 2224/29444* (2013.01); *H01L 2224/29499* (2013.01); *H01L 2224/32225* (2013.01); *H01L 2224/81193* (2013.01); *H05K 3/323* (2013.01); *H05K 2201/10106* (2013.01); *H05K 2201/10674* (2013.01); *Y10T 428/24562* (2015.01)

(58) Field of Classification Search
CPC ... H01L 2224/2939; H01L 2224/29444; H01L 2224/29499; H01L 2224/32225; H01L 2224/81193; H01L 24/27; H01L 24/29; H01L 24/32; B32B 37/185; B32B 3/30; B32B 27/20; B32B 37/025; B32B 37/24; B32B 37/1207; B32B 2037/1253; B32B 2307/202; B32B 2310/0831; B32B 2457/00; H05K 3/323; H05K 2201/10106; H05K 2201/10674
USPC ....... 174/259, 260, 255, 256, 520, 261, 262, 174/264, 265
See application file for complete search history.

(56) References Cited

U.S. PATENT DOCUMENTS

| | | | | |
|---|---|---|---|---|
| 9,953,947 B2* | 4/2018 | Tsukao | ................... | H01L 24/32 |
| 9,960,139 B2* | 5/2018 | Sato | ..................... | H01L 24/29 |
| 9,997,486 B2* | 6/2018 | Akutsu | ................... | H01L 24/27 |
| 10,026,709 B2* | 7/2018 | Akutsu | ................... | H01L 24/32 |

FOREIGN PATENT DOCUMENTS

| | | | |
|---|---|---|---|
| JP | 2007-080522 | A | 3/2007 |
| JP | 2007-217503 | A | 8/2007 |
| JP | 2010-033793 | A | 2/2010 |
| JP | 2010-251337 | A | 11/2010 |
| JP | 2011-109149 | A | 6/2011 |
| WO | 2005/054388 | A1 | 6/2005 |
| WO | 2011/152421 | A1 | 12/2011 |

OTHER PUBLICATIONS

Feb. 5, 2019 Office Action issued in Japanese Patent Application No. 2017-127213.
Feb. 5, 2019 Office Action issued in Japanese Patent Application No. 2017-127210.
Oct. 11, 2018 Notification of Reasons for Refusal issued in Korean Patent Application No. 519980693842.

* cited by examiner

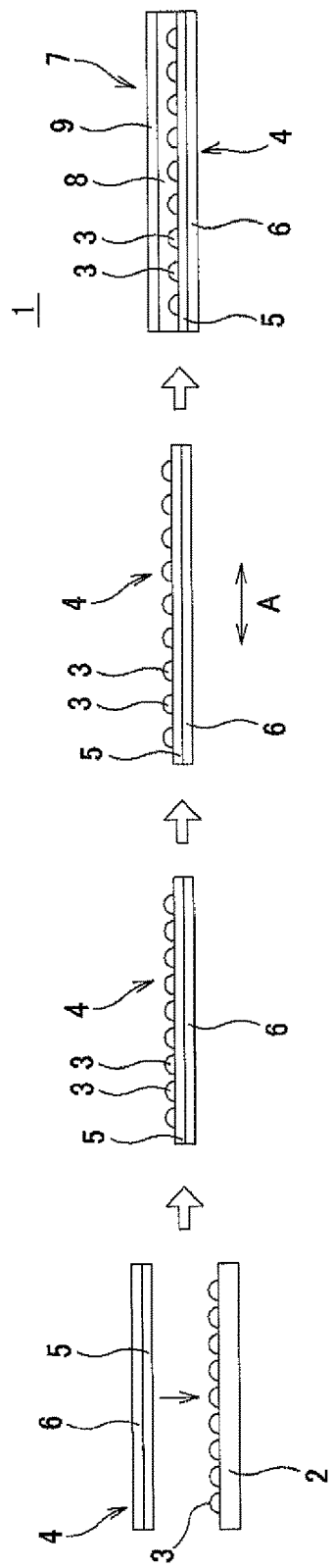

METHOD FOR MANUFACTURING ANISOTROPICALLY CONDUCTIVE FILM, ANISOTROPICALLY CONDUCTIVE FILM, AND CONDUCTIVE STRUCTURE

TECHNICAL FIELD

The present invention relates to methods for manufacturing anisotropic conductive films, anisotropic conductive films, and connected structures, and more particularly, to a method for manufacturing an anisotropic conductive film that excels in dispersing conductive particles and trapping the particles, and is capable of maintaining conduction reliability even between narrow-pitched terminals, the anisotropic conductive film, and a connected structure. This application claims benefit of priority to Japanese Patent Application No. 2012-171331, filed on Aug. 1, 2012, and Japanese Patent Application Nos. 2013-160116, 2013-160117, and 2013-160118, filed on Aug. 1, 2013, the entire contents of which are incorporated by reference herein.

BACKGROUND ART

An anisotropic conductive film (ACF) is formed by dispersing conductive particles in an insulating binder resin that functions as an adhesive agent. A conventional anisotropic conductive film is in the form of a sheet, as a binder resin composition having conductive particles dispersed therein is applied onto a base film. When an anisotropic conductive film is used, the anisotropic conductive film is inserted between the bumps of an electronic component and the electrode terminals of a wiring board, and heat and pressure are applied to the anisotropic conductive film with a heating/pressing head. As a result, the conductive particles are flattened by the bumps and the electrode terminals, and the binder resin is hardened in such a situation. Thus, an electrical and mechanical connection is achieved. At the portions without bumps, the conductive particles remain dispersed in the binder resin, and continue to be electrically insulated. Accordingly, electrical conduction is provided only at the portions with the bumps. The thickness of the anisotropic conductive film is equal to or greater than the height of the bumps of the electronic component and the electrodes of the wiring board, and extra adhesive components are pushed away to the peripheries of the electrodes by the pressing force from the heating/pressing head.

In many anisotropic conductive films, the proportion of conductive particles is 5 to 15 volume % relative to the volume of the adhesive components. If the proportion of conductive particles is less than 5 volume %, the amount of conductive particles existing between bumps and electrode terminals (this amount is generally called "particle trapping rate") becomes smaller, and conduction reliability might decrease. If the proportion of conductive particles exceeds 15 volume %, on the other hand, joined conductive particles exist between adjacent electrode terminals, and might cause short-circuiting.

However, if the proportion of conductive particles dispersed in an anisotropic conductive film is simply optimized, most of the conductive particles is pushed away at the time of pressure bonding, and many conductive particles fail to contribute to conduction. Also, the conductive particles pushed away form particle pools between adjacent electrode terminals, and are in danger of causing short-circuiting. As the interval between the electrode terminals is made shorter, the possibility of short-circuiting becomes higher, and it is not possible to cope with high-density packaging.

In view of such circumstances, there have been suggested techniques by which conductive particles in an anisotropic conductive film are not randomly dispersed, but are uniformly dispersed in a binder resin layer (see Patent Literatures 1 and 2).

CITATION LIST

Patent Literatures

Patent Literature 1: WO 2005/054388
Patent Literature 2: JP 2010-251337 A

SUMMARY OF INVENTION

Technical Problem

Patent Literature 1 discloses an anisotropic conductive film manufacturing method that includes: forming a stack film by forming an adhesive layer on a biaxially-stretchable film; densely filling the stack film with conductive particles; biaxially stretching the film having the conductive particles attached thereto so that the interval between the conductive particles becomes 1 to 5 times the mean particle size or 20 μm or shorter, the stretched state being maintained; and transferring and attaching the conductive particles to an insulating adhesive sheet.

Patent Literature 2 discloses an anisotropic conductive film in which conductive particles are unevenly dispersed in accordance with a pattern of objects to be connected.

In the invention disclosed in Patent Literature 1, however, it is difficult to densely bury the conductive particles prior to the biaxial stretching process, and sparse portions not filled with the particles are easily formed. If the biaxial stretching is performed in such a state, a large space without any conductive particles is formed, and the particle trapping performance between the bumps of an electronic component and the electrode terminals of a wiring board is degraded. As a result, conduction defects might occur. It is also difficult to biaxially stretch the film uniformly with high precision.

In the invention disclosed in Patent Literature 2, conductive particles are unevenly dispersed beforehand in accordance with an electrode pattern. Therefore, an alignment process becomes necessary when the anisotropic conductive film is bonded to the connection target, and the procedures in connecting to narrow-pitched electrode terminals might become complicated. Also, the uneven dispersion pattern of the conductive particles needs to be changed in accordance with the electrode pattern of the connection target, and such anisotropic conductive films are not suitable for mass production.

Therefore, the present invention aims to provide a method for manufacturing an anisotropic conductive film that excels in dispersing conductive particles and trapping the particles, and is capable of maintaining conduction reliability even between narrow-pitched terminals, the anisotropic conductive film, and a connected structure.

Solution to Problem

To solve the above problems, an aspect of the present invention is a method for manufacturing an anisotropic conductive film containing conductive particles, the method including: filling grooves regularly formed in the same direction in a sheet with the conductive particles, and arranging the conductive particles; laminating a photo- or thermo-setting resin layer of a first resin film on the surface of the sheet on the side having the grooves formed thereon, the first resin film having the resin layer formed on a stretchable base film; transferring and attaching the conductive particles to the resin layer of the first resin film; uniaxially stretching the first resin film in a direction other than the direction perpendicular to the array direction of the conductive particles, with the conductive particles having being transferred and attached to the resin layer; and laminating a second resin film on the resin layer of the first resin film having the conductive particles placed thereon, the second resin film having a photo- or thermo-setting resin layer formed on a base film.

Another aspect of the present invention is an anisotropic conductive film formed with at least two layer structures. The anisotropic conductive film includes: a first resin layer forming a layer; a second resin layer laminated on the first resin layer; and conductive particles in contact with at least the first resin layer between the first resin layer and the second resin layer. In this anisotropic conductive film, the conductive particles are regularly arranged in a first direction on the first resin layer to form particle rows regularly arranged in parallel in a second direction different from the first direction. The first resin layer has portions between the conductive particles in the first direction, and portions between the conductive particles in the second direction, the portions between the conductive particles in the first direction being thinner than the portions between the conductive particles in the second direction.

Yet another aspect of the present invention is a connected structure using the above anisotropic conductive film for connecting an electronic component thereto.

Advantageous Effects of Invention

In one aspect of the present invention, the conductive particles are arranged beforehand in the groove pattern in the sheet, so that the conductive particles can be uniformly dispersed by uniaxially stretching the first resin film having the conductive particles transferred and attached thereto. Accordingly, the anisotropic conductive film contains the minimum amount of the conductive particles to be uniformly dispersed over the entire film surface, and does not need to contain an excess amount of the conductive particles. Also, the anisotropic conductive film has no possibility of causing short-circuiting between terminals due to extra conductive particles. Also, as the conductive particles are uniformly dispersed, the anisotropic conductive film can certainly provide conduction between electrode terminals at narrow pitch.

In another aspect of the present invention, in an anisotropic conductive film compatible with narrower pitch, the positions of the conductive particles that are uniformly dispersed can be certainly controlled, and conduction between narrow-pitched terminals can be provided without fail.

Furthermore, in yet another aspect of the present invention, good connectivity between the substrate of a connected structure and an electronic component can be secured, and long-term connection reliability can be improved.

BRIEF DESCRIPTION OF DRAWINGS

FIGS. 2A through 2D are cross-sectional views showing the procedures for manufacturing an anisotropic conductive film to which the present invention is applied.

DESCRIPTION OF EMBODIMENTS

The following is a detailed description of preferred embodiments of methods for manufacturing an anisotropic conductive film to which the present invention is applied, with reference to the drawings. It should be understood that the present invention is not limited to the embodiments described below, and various changes can be made to them without departing from the scope of the invention. The drawings are merely schematic, and the proportions and the like of respective sizes might differ from those in reality. Specific sizes and the like should be determined by taking into account the description below. It should also be understood that the relationship or ratio between sizes might differ among some of the drawings.

First Embodiment

Figure 1A:
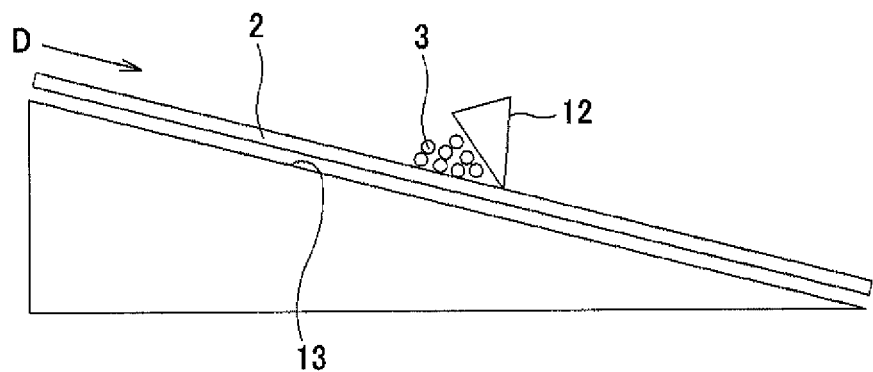
FIGS. 1A and 1B are side views showing an example case where conductive particles are buried and arranged in grooves in a sheet.

In a first embodiment, as shown in FIGS. 1A through 2D, a method for manufacturing an anisotropic conductive film 1 to which the present invention is applied includes: (1) filling grooves regularly formed in the same direction in a sheet 2 with conductive particles 3, and arranging the conductive particles 3 (FIGS. 1A and 1B); (2) laminating a photo- or thermo-setting resin layer 5 of a first resin film 4 on the grooved surface of the sheet 2, the first resin film 4 having the resin layer 5 formed on a stretchable base film 6 (FIG. 2A); (3) transferring and attaching the conductive particles 3 to the resin layer 5 of the first resin film 4 (FIG. 2B); (4) uniaxially stretching the first resin film 4 in the direction indicated by an arrow A in FIG. 2C, which is not the direction perpendicular to the array direction of the conductive particles 3, with the conductive particles 3 having been transferred and attached to the resin layer 5 (FIG. 2C); and (5) laminating a second resin film 7 on the resin layer 5 of the first resin film 4 having the conductive particles 3 placed thereon, the second resin film 7 having a photo- or thermo-setting resin layer 8 formed on a base film 9 (FIG. 2D).

[Sheet]

As shown in FIGS. 3A through 3D, a sheet 2 having grooves regularly formed in the same direction is a resin sheet having predetermined grooves 10 formed therein, for example, and can be formed by injecting a melted pellet into a metal mold having a groove pattern formed therein and cooling and solidifying it to transfer the predetermined grooves 10. Alternatively, the sheet 2 can be formed by heating a metal mold having a groove pattern formed therein to a temperature equal to or higher than the softening point of the resin sheet, and pressing the resin sheet against the metal mold to transfer the grooves.

The material forming the sheet 2 may be any thermomeltable material to which the shape of a metal mold having the pattern of the grooves 10 therein can be transferred. The material of the sheet 2 preferably has resistance to solvents, resistance to heat, and mold releasability. Examples of such resin sheets include thermoplastic resin films of polypropylene, polyethylene, polyester, PET, nylon, an ionomer, polyvinyl alcohol, polycarbonate, polystyrene, polyacrylonitrile, an ethylene-vinyl acetate copolymer, an ethylene-vinyl alcohol copolymer, an ethylene-methacrylic acid copolymer, and the like. Alternatively, the resin sheet may be a so-called prism sheet having a minute concavity and convexity pattern formed therein, for example.

Figure 3A:
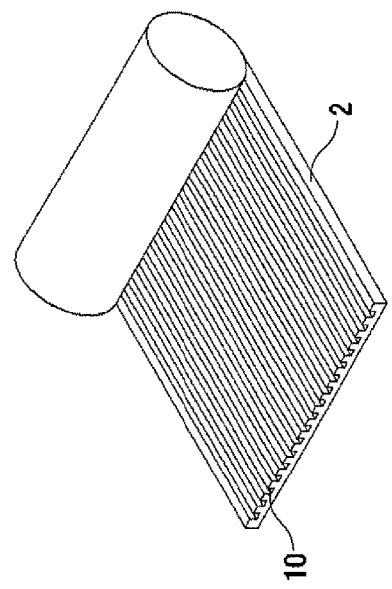
FIGS. 3A through 3D are perspective views showing various patterns of grooves in sheets.
Figure 3B:
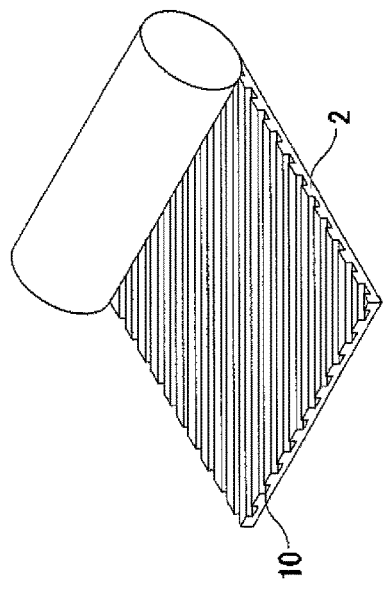
Figure 3C:
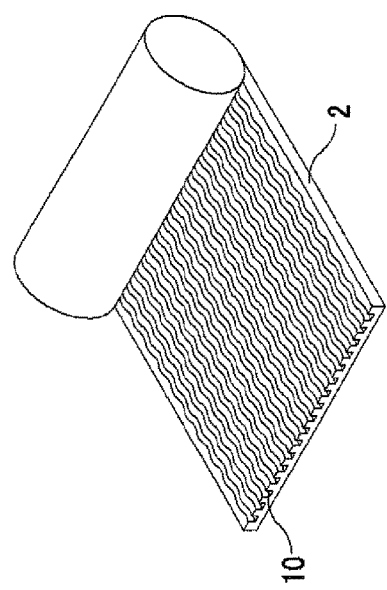
Figure 3D:
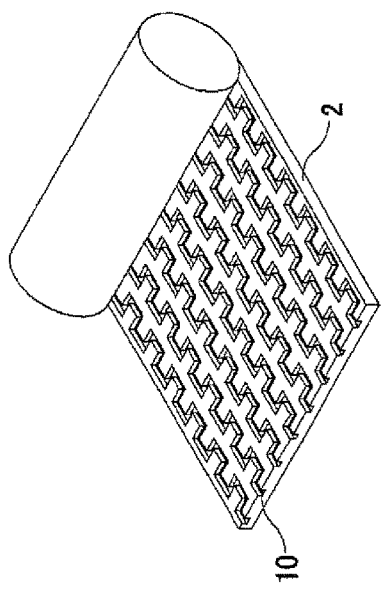

As shown in FIGS. 3A through 3D, the pattern of the grooves 10 formed in the sheet 2 is formed with grooves that are regularly formed in the same direction and are adjacent to one another in a direction perpendicular to the longitudinal direction of the grooves. As shown in FIG. 3A, the grooves 10 may be regularly formed in the longitudinal direction of the sheet 2. As shown in FIG. 3B, the grooves 10 may be regularly formed in a direction oblique to the longitudinal direction of the sheet 2. As shown in FIG. 3C, the grooves 10 may be tortuously formed in the longitudinal direction of the sheet 2. As shown in FIG. 3D, the grooves 10 may be regularly formed in the form of square waves in the longitudinal direction of the sheet 2. Other than the above, the grooves 10 may have a zigzag form, a grid-like form, or the like.

As shown in FIGS. 4A through 4J, the grooves 10 may have various types of shapes. At this point, the size of the grooves 10 is determined by taking into account ease of filling with the conductive particles 3, and ease of transfer and attachment of the filling conductive particles 3 to the first resin film 4. If the grooves 10 are too large compared with the particle size of the conductive particles 3, it is difficult for the grooves 10 to hold the conductive particles, and the filling becomes insufficient. If the grooves 10 are too small compared with the particle size of the conductive particles 3, the grooves 10 cannot be filled with the conductive particles 3, and the filling becomes insufficient. Furthermore, the conductive particles 3 are engaged with the grooves 10, and cannot be transferred to the first resin film 4. Therefore, the grooves 10 are designed to have a width W that is equal to or greater than the particle size of the conductive particles 3 but is smaller than 2.5 times the particle size of the conductive particles 3, and have a depth D that is 0.5 to two times the particle size of the conductive particles 3. The grooves 10 preferably have a width W that is equal to or greater than the particle size of the conductive particles 3 but is smaller than twice the particle size of the conductive particles 3, and preferably have a depth D that is 0.5 to 1.5 times the particle size of the conductive particles 3.

[Conductive Particles]

The conductive particles 3 may be any known conductive particles that are used in anisotropic conductive films. Examples of the conductive particles 3 include particles of metals such as nickel, iron, copper, aluminum, tin, lead, chromium, cobalt, silver, and gold, particles of metal alloys of those metals, metal-coated particles of a metal oxide, carbon, graphite, glass, ceramic, and plastic, and those particles further coated with an insulating thin film. In a case where the conductive particles 3 are resin particles coated with a metal, examples of the resin particles include particles of epoxy resin, phenol resin, acrylic resin, acrylonitrile-styrene (AS) resin, benzoguanamine resin, divinylbenzene-based resin, styrene-based resin, and the like.

Such conductive particles 3 are arranged along the grooves 10 in the sheet 2 when the grooves 10 are filled with the conductive particles 3. As shown in FIG. 1A, the grooves 10 are filled with the conductive particles 3 by a squeegee 12 that is brought into contact with the surface of the sheet 2, for example. The sheet 2 is placed on an inclined surface 13, and is conveyed downward as indicated by an arrow D in FIG. 1A. The conductive particles 3 are supplied to the upstream side of the conveying direction of the sheet 2 by the squeegee 12, so that the conductive particles 3 fill the grooves 10 and are arranged in the grooves 10 as the sheet 2 is conveyed.

Figure 1B:
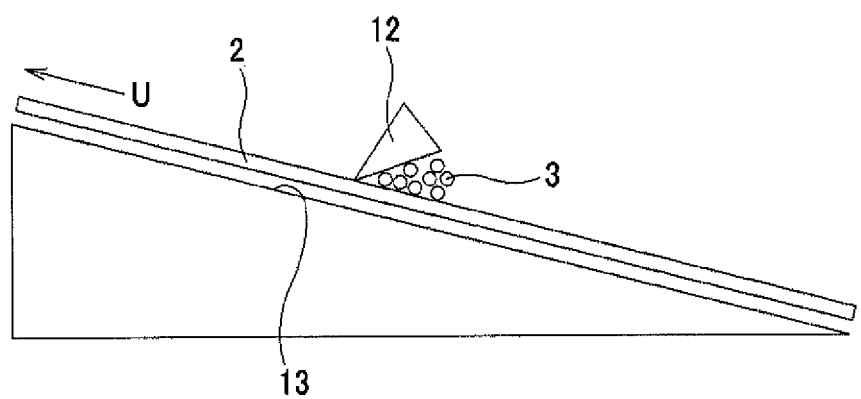

As shown in FIG. 1B, the conductive particles 3 may be supplied by the squeegee 12 to the upstream side of the conveying direction of the sheet 2 being conveyed upward on the inclined surface 13 as indicated by an arrow U, so that the conductive particles 3 fill the grooves 10 and are arranged in the grooves 10 as the sheet 2 is conveyed. Other than those methods using the squeegee 12, the conductive particles 3 sprinkled onto the surface of the sheet 2 having the grooves 10 formed thereon may be subjected to one or more kinds of external force such as ultrasonic vibration, wind force, static electricity, and magnetic force from the back surface side of the sheet 2, so that the conductive particles 3 fill the grooves 10 and are arranged in the grooves 10. Further, the conductive particles 3 in a wet state may fill the grooves 10 and be arranged in the grooves 10 (a wet process), or the conductive particles 3 in a dry state may fill the grooves 10 and be arranged in the grooves 10 (a dry process).

[First Resin Film/Resin Layer/Stretchable Base Film]

The first resin film 4 laminated on the sheet 2 having the conductive particles 3 filling the grooves 10 and arranged in the grooves 10 is a thermo-setting or ultraviolet-curing adhesive film having the photo- or thermo-setting resin layer 5 formed on the stretchable base film 6. As the first resin film 4 is laminated on the sheet 2, the conductive particles 3 arranged in the pattern of the grooves 10 are transferred and attached to the first resin film 4, to form the anisotropic conductive film 1.

The first resin film 4 has the resin layer 5 formed by applying a conventional binder resin (an adhesive agent) containing a film-forming resin, a thermo-setting resin, a latent hardener, a silane coupling agent, or the like to the base film 6, and the first resin film 4 is molded into the form of a film.

The stretchable base film 6 is formed by applying a release agent such as silicone to PET (Poly Ethylene Terephthalate), OPP (Oriented Polypropylene), PMP (Poly-4-methlpentene-1), or PTFE (Polytetrafluoroethylene), for example.

The film-forming resin forming the resin layer 5 is preferably a resin of approximately 10,000 to 80,000 in mean molecular weight. Examples of such film-forming resins include various kinds of resins such as epoxy resin, modified epoxy resin, urethane resin, and phenoxy resin. Of these resins, phenoxy resin is particularly preferable from the viewpoint of a film-forming state, connection reliability, and the like.

The thermo-setting resin is not particularly limited, and may be a commercially-available epoxy resin or acrylic resin, for example.

Although the epoxy resin is not particularly limited, examples of such epoxy resins include a naphthalene-type epoxy resin, a biphenyl-type epoxy resin, a phenol-novolak-type epoxy resin, a bisphenol-type epoxy resin, a stilbene-type epoxy resin, a triphenolmethane-type epoxy resin, a phenol-aralkyl-type epoxy resin, a naphthol-type epoxy resin, a dicyclopentadiene-type epoxy resin, and a triphenyl-methane-type epoxy resin. It is possible to use one of these epoxy resins or a combination of two or more of these epoxy resins.

The acrylic resin is not particularly limited, and an acrylic compound, liquid acrylate, or the like can be appropriately selected in accordance with the purpose. Examples of such acrylic resins include methyl acrylate, ethyl acrylate, isopropyl acrylate, isobutyl acrylate, epoxy acrylate, ethyleneglycol diacrylate, diethyleneglycol diacrylate, trimethylolpropane triacrylate, dimethylol tricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl)isocyanurate, urethane acrylate, or the like. In these acrylic resins, acrylates may be replaced with methacrylates. It is possible to use one of these acrylic resins or a combination of two or more of these acrylic resins.

The latent hardener is not particularly limited, but examples of such latent hardeners include various kinds of hardeners such as a thermo-setting type and a UV-curing type. A latent hardener does not react in a normal state, but is activated by a trigger selected in accordance with the purpose of use such as application of heat, light, or pressure, and starts to react. Examples of methods for activating a heat-activated latent hardener include a method for generating active species (such as cations, anions, or radicals) through a dissociative reaction by heating, a method for dispersing a heat-activated latent hardener in the epoxy resin in a stable state at a temperature close to room temperature, compatibilizing and dissolving the hardener with the epoxy resin at a high temperature, and starting a hardening reaction, a method for eluting a hardener of a molecular sieve sealing type and starting a hardening reaction, and an elution and hardening method using microcapsules. Examples of heat-activated latent hardeners include imidazoles, hydrazides, boron trifluoride-amine complex, sulfonium salts, aminimide, polyamine salts, dicyandiamide, and modified materials of these hardeners. It is possible to use one of these hardeners or a combination of two or more of these hardeners. Of these materials, a microcapsule imidazole latent hardener is particularly preferable.

The silane coupling agent is not particularly limited, but may be of an epoxy type, an amino type, a mercapto-sulfide type, a ureide type, or the like. With the addition of the silane coupling agent, the adhesive properties at the interface between an organic material and an inorganic material are improved.

From the viewpoint of ease in handling, preservation stability, and the like, the first resin film 4 may have a cover film formed on the surface of the resin layer 5 on the opposite side from the surface on which the base film 6 is stacked. The shape of the first resin film 4 is not particularly limited. If the first resin film 4 has a long sheet-like form that can be wound around a winding reel, a portion of a predetermined length can be cut from the first resin film 4 and be used.

[Second Resin Film]

Like the first resin film 4, the second resin film 7 laminated on the first resin film 4 having the conductive particles 3 transferred and attached thereto is a thermo-setting or ultraviolet-curing adhesive film having the photo- or thermo-setting resin layer 8 formed on the base film 9. The resin layer 8 of the second resin film 7 may be the same as the resin layer 5 of the first resin film 4, and the base film 9 may be the same as the base film 6 of the first resin film 4. As the second resin film 7 is laminated on the first resin film 4 having the conductive particles 3 transferred and attached thereto, the second resin film 7, together with the first resin film 4, forms the anisotropic conductive film 1.

After the base films 6 and 9 are removed, this anisotropic conductive film 1 is inserted between bumps of an electronic component and electrode terminals of a wiring board, for example. When heat and pressure are applied with a heating/pressing head (not shown), the conductive particles 3 are pressed and flattened between the bumps and the electrode terminals, and the conductive particles 3 in the flattened state are hardened by heating or ultraviolet irradiation. As a result, the anisotropic conductive film 1 electrically and mechanically connects the electronic component and the wiring board.

[Method for Manufacturing the Anisotropic Conductive Film]

Next, the procedures for manufacturing the anisotropic conductive film 1 are described.

First, the conductive particles 3 fill the grooves 10 formed in a predetermined pattern on the sheet 2, and are arranged in the grooves 10 (see FIGS. 1A and 1B). The conductive particles 3 can fill the grooves 10 and be arranged in the grooves 10 by a method using a squeegee, a method for applying one or more kinds of external force such as ultrasonic vibration, wind force, static electricity, and magnetic force from the back surface side of the sheet 2, or the like.

The resin layer 5 of the first resin film 4 is then laminated on the surface of the sheet 2 on the side of the conductive particles 3 (see FIG. 2A). After the resin layer 5 is placed on the surface of the sheet 2, lamination is performed by applying a low pressure to the first resin film 4 with a heating/pressing head, and thermally pressurizing the first resin film 4 for a short time at such a temperature that the binder resin exhibits tackiness as appropriate but does not start thermal hardening.

After the first resin film 4 is laminated and cooled, the sheet 2 and the first resin film 4 are separated from each other, so that the conductive particles 3 are transferred and attached to the first resin film 4 (see FIG. 2B). The first resin film 4 has the conductive particles 3 arranged in the pattern corresponding to the pattern of the grooves 10 on the surface of the resin layer 5.

Figure 5:
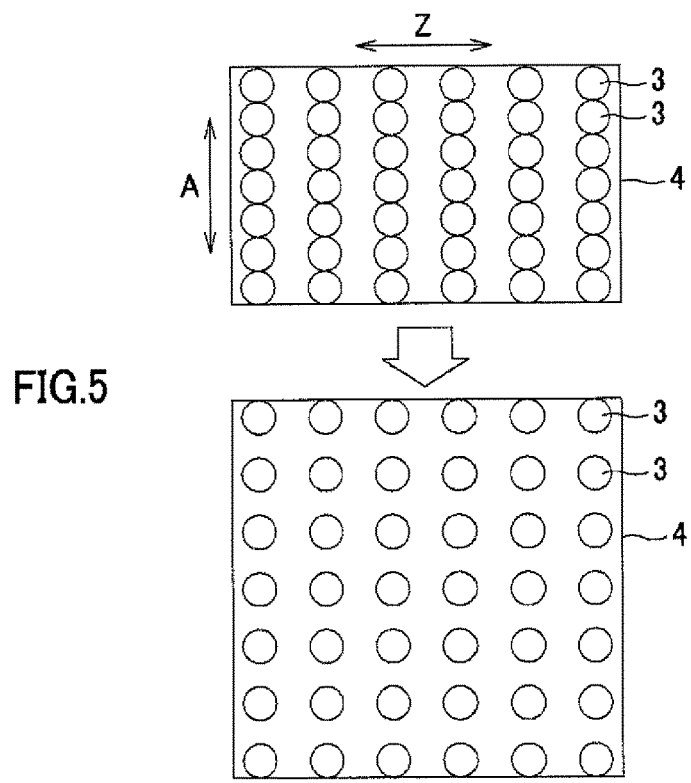
FIG. 5 is a plan view showing a process of stretching a first resin film.
Figure 6:
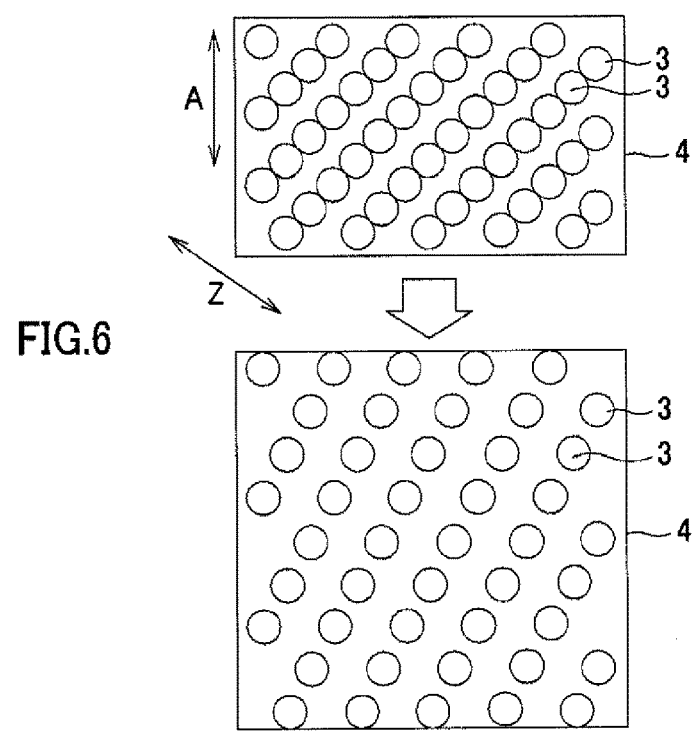
FIG. 6 is a plan view showing a process of stretching a first resin film.

The first resin film 4 is then uniaxially stretched in a direction other than the direction perpendicular to the array direction of the conductive particles 3 (see FIG. 2C). As a result, the conductive particles 3 are dispersed as shown in FIG. 5 or 6. The stretching direction is not the direction perpendicular to the array direction of the conductive particles 3, because the conductive particles 3 are already dispersed in the direction perpendicular to the array direction, having been arranged in accordance with the pattern of the grooves 10. As the first resin film 4 is uniaxially stretched in a direction other than the direction perpendicular to the array direction, the conductive particles 3 in contact with one another in the array direction can be dispersed.

Therefore, in FIG. 5, the first resin film 4 is preferably stretched in the direction indicated by an arrow A shown in the drawing, and is not stretched in the direction indicated by an arrow Z. In FIG. 6, the first resin film 4 is preferably stretched in any one direction other than the direction indicated by an arrow Z shown in the drawing, or is preferably stretched in the direction that is the longitudinal direction of the first resin film 4 and is indicated by an arrow A in the drawing, for example.

The first resin film 4 is uniaxially stretched 200% in an oven at 130° C., with the use of a stretching machine of a pantograph type, for example. As the first resin film 4 is uniaxially stretched in the longitudinal direction, the stretching can be easily performed with high precision.

The resin layer 8 of the second resin film 7 is then laminated on the resin layer 5 of the first resin film 4 having the conductive particles 3 placed thereon (see FIG. 2D). After the resin layer 8 is placed on the surface of the resin layer 5 of the first resin film 4, the second resin film 7 is laminated by applying a low pressure thereto with a heating/pressing head, and thermally pressurizing the second resin film 7 for a short time at such a temperature that the binder resin exhibits tackiness as appropriate but does not start thermal hardening.

Through the above procedures, the anisotropic conductive film 1 is manufactured. Since the conductive particles 3 are arranged beforehand in accordance with the pattern of the grooves 10 in the sheet 2 in such an anisotropic conductive film 1, the conductive particles 3 can be uniformly dispersed by uniaxially stretching the first resin film 4 having the conductive particles 3 transferred and attached thereto. Accordingly, the anisotropic conductive film 1 contains the minimum amount of the conductive particles 3 to be uniformly dispersed over the entire film surface, and does not need to contain an excess amount of the conductive particles 3. Also, the anisotropic conductive film 1 has no possibility of causing short-circuiting between terminals due to extra conductive particles 3. Also, as the conductive particles 3 are uniformly dispersed, the anisotropic conductive film 1 can certainly provide conduction between electrode terminals at narrow pitch.

As described above, by the method for manufacturing an anisotropic conductive film according to an embodiment of the present invention, the first resin film 4 is uniaxially stretched 200%, or is extended to a length greater than 150% of the original length of the first resin film 4, but the stretch rate is not particularly limited. That is, when the first resin film 4 including the first resin layer 5 having the conductive particles 3 transferred and attached thereto is uniaxially stretched in a direction other than the direction perpendicular to the array direction of the conductive particles 3, the first resin film 4 can be uniaxially stretched more than 150%, to manufacture the anisotropic conductive film 1. In this embodiment, it is confirmed that the stretch rate can be increased up to 700% when the first resin film 4 is uniaxially stretched, as described later in Examples. The method for manufacturing the anisotropic conductive film 1 according to the first embodiment of the present invention is not limited to 700% or lower in the stretch rate.

As the first resin film 4 is uniaxially stretched to a length greater than 150% of the original length thereof, the possibility of short-circuiting in the anisotropic conductive film 1 can be reduced. Also, when manufacturing an anisotropic conductive film to be used in a connected structure or the like having electrode terminals arranged at certain intervals or longer, an anisotropic conductive film that can certainly provide conduction between terminals can be manufactured by applying the method for manufacturing an anisotropic conductive film according to this embodiment. That is, the method for manufacturing an anisotropic conductive film according to this embodiment can be applied to manufacture of anisotropic conductive films other than those compatible with fine pitch.

[Anisotropic Conductive Film]

Figure 7:
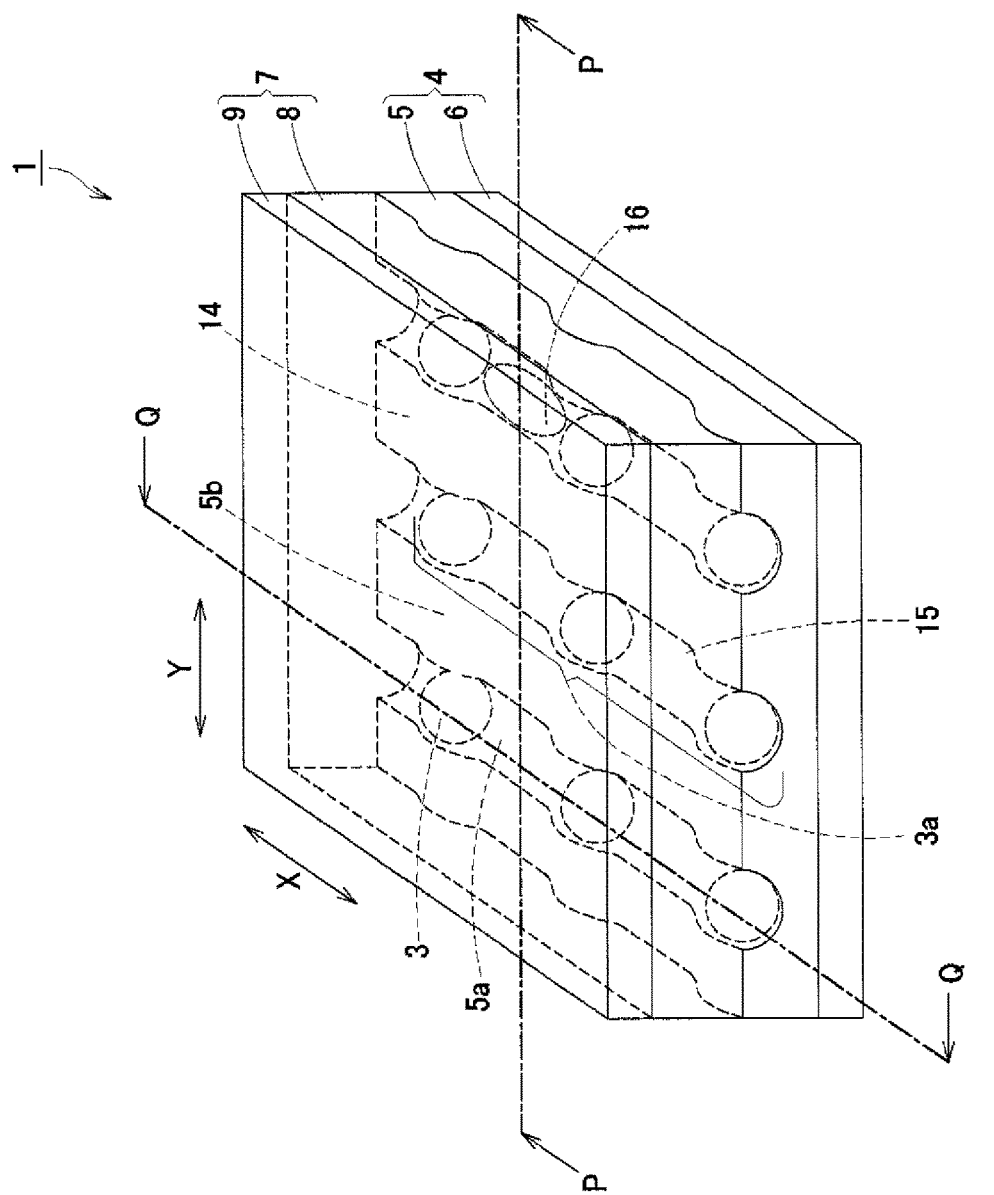
FIG. 7 is a partial perspective view of an anisotropic conductive film according to a first embodiment of the present invention.
Figure 8A:
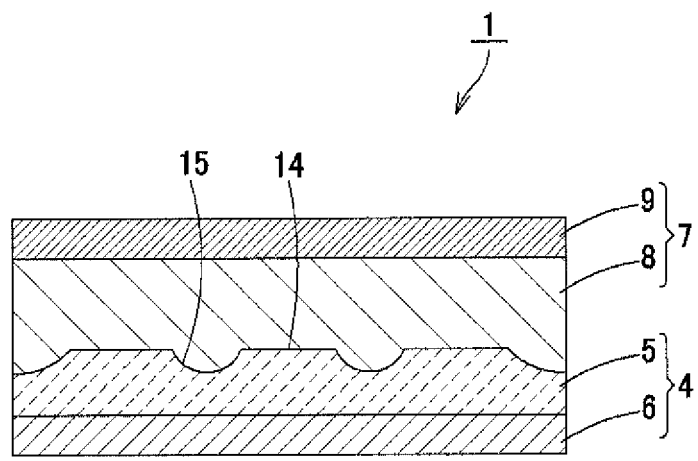
FIG. 8A is a cross-sectional view of the anisotropic conductive film, taken along the line P-P of FIG. 7.
Figure 8B:
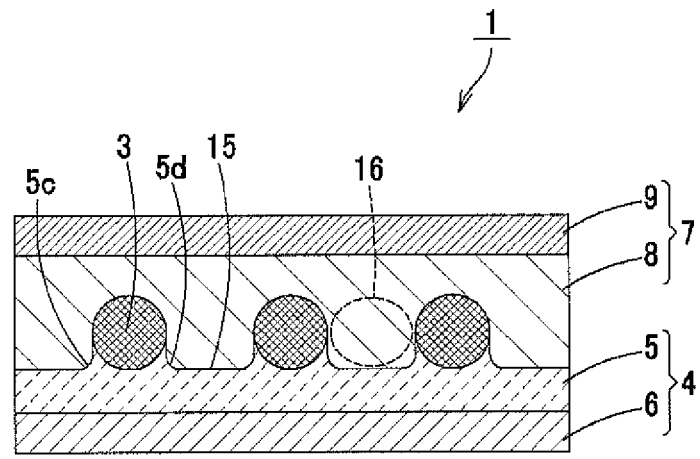
FIG. 8B is another cross-sectional view of the anisotropic conductive film, taken along the line Q-Q of FIG. 7.
Figure 9:
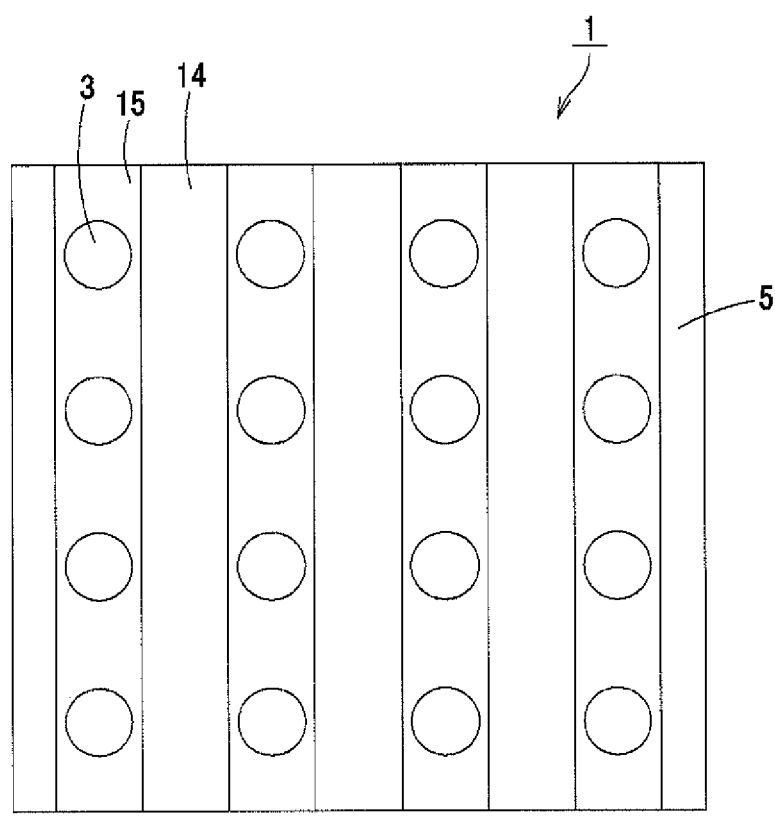
FIG. 9 is a plan view showing an arranged state of the conductive particles in the anisotropic conductive film according to the first embodiment of the present invention.

Next, the structure of the anisotropic conductive film according to the first embodiment of the present invention is described, with reference to drawings. FIG. 7 is a partial perspective view of the anisotropic conductive film according to the first embodiment of the present invention. FIG. 8A is a cross-sectional view of the anisotropic conductive film, taken along the line P-P defined in FIG. 7. FIG. 8B is a cross-sectional view of the anisotropic conductive film, taken along the line Q-Q defined in FIG. 7. FIG. 9 is a plan view showing the arranged state of the conductive particles of the anisotropic conductive film according to the first embodiment of the present invention.

As shown in FIG. 7, the anisotropic conductive film 1 of this embodiment is formed with two or more film layers including the first resin film 4 and the second resin film 7. The first resin film 4 is a resin film that has the resin layer (first resin layer) 5 formed by applying a binder resin (an adhesive agent) onto the base film 6, and is molded into the form of a film. The second resin film 7 is a thermo-setting or ultraviolet-curing adhesive film having the photo- or thermo-setting resin layer (second resin layer) 8 formed on the base film 9, and is a resin film laminated on the first resin film 4 including the first resin layer 5 having the conductive particles 3 transferred and attached thereto.

As described above, the anisotropic conductive film 1 of this embodiment has a structure in which the second resin film 7 is laminated on the first resin film 4, and the conductive particles 3 are held between the first resin layer 5 and the second resin layer 8. In this embodiment, the anisotropic conductive film 1 is formed with the two layers of the first resin film 4 including the first resin layer 5 and the base film 6, and the second resin film 7 including the second resin layer 8 and the base film 9. However, the anisotropic conductive film 1 is formed with at least two layers, and the anisotropic conductive film 1 according to an embodiment of the present invention can be applied to an anisotropic conductive film in which more resin layers such as a third resin layer are laminated, for example.

As shown in FIG. 7, the conductive particles 3 are formed and regularly arranged in the X-direction (a first direction) in the first resin layer 5. As particle rows 3a are regularly arranged in parallel in the Y-direction (a second direction) different from the X-direction, the conductive particles 3 are in a dispersed state. Alternatively, the conductive particles 3 may be arranged at predetermined intervals. In this embodiment, the first resin layer 5 has convex portions 14 that are designed in roof-like shapes so that the portions between the respective particles rows 3a extend in the X-direction, as shown in FIGS. 7 and 8A. That is, in the first resin layer 5, the convex portions 14 extending in the X-direction are formed at predetermined intervals in the Y-direction.

As shown in FIG. 7, in the first resin layer 5, groove-like concave portions 15 extending in the X-direction are formed between the convex portions 14, and the conductive particles 3 are regularly placed in these concave portions 15. The directionality of the X-direction (first direction) and the Y-direction (second direction) might be presented as an optical difference. This is because groove-like voids are formed between the conductive particles 3 when the first resin layer 5 is stretched in the X-direction. These voids are the clearances 16 described later. Such voids are formed because the stretching is performed where the conductive particles 3 are arranged in straight lines. That is, the first resin layer 5 does not exist in or almost disappears from at least one of the substantially straight lines near the conductive particles 3 at the time of stretching, and this affects the mobility of the conductive particles 3 at the time of pressurization. This aspect also affects the concave portions 15 and the convex portions 14 described later.

Since the clearances 16 are voids that are formed when the first resin film 4 is stretched, a situation where steep cliff-like portions are formed is caused in the first resin layer 5 in terms of thickness in the stretching direction near the conductive particles 3. As described above, since such a situation is caused in the stretching direction of the first resin film 4, identical cliff-like portions 5c and 5d at two sites located on a substantially straight line hold a conductive particle 3 as shown in FIG. 8B, and this situation is caused among the conductive particles 3 in the first direction. This determines the moving direction of the conductive particles 3 at the time of joining. In this embodiment, the X-direction (first direction) is the longitudinal direction of the anisotropic conductive film 1, and the Y-direction (second direction) is the width direction of the anisotropic conductive film 1.

As described above, in the first resin layer 5, the convex portions 14 and the concave portions 15 that extend in the X-direction are formed in parallel. Since the conductive particles 3 are regularly arranged in the respective concave portions 15, the clearances 16 exist between the conductive particles 3 forming the particle rows 3a in the concave portions 15, and the second resin layer 8 enters the clearances 16, as shown in FIGS. 7 and 8B. In this manner, the conductive particles 3 are dispersed and held between the first resin layer 5 and the second resin layer 8. Although the conductive particles 3 are dispersed and held between the first resin layer 5 and the second resin layer 8 in this embodiment, the conductive particles 3 exist only in the first resin layer 5 in a case where the conductive particles 3 are buried in the first resin layer 5 by external force or the like at the time of the transfer before the stretching. In an embodiment of the present invention, the stretching may be performed after the conductive particles 3 are buried in the first resin layer 5. That is, the anisotropic conductive film 1 of this embodiment may have a structure in which the conductive particles 3 are in contact with at least the first resin layer 5 between the first resin layer 5 and the second resin layer 8. In this case, the portions of the first resin layer 5 near the conductive particles 3 each have identical cliff-like portions 5c and 5d at two sites located on a substantially straight line. The reason for this has already been described.

As described above, in the anisotropic conductive film 1 of this embodiment compatible with narrower pitch, the positions of the conductive particles 3 that are uniformly dispersed can be certainly controlled, and conduction between narrow-pitched terminals can be provided without fail. In this embodiment, so as to maintain connection reliability of the anisotropic conductive film 1, the interval between the conductive particles 3 in the X-direction is longer than the interval between the conductive particles 3 in the Y-direction in the anisotropic conductive film 1, and the difference is preferably about half the particle size of the conductive particles 3.

Also, in this embodiment, when the first resin film 4 is uniaxially stretched in a direction other than the direction perpendicular to the array direction of the conductive particles 3 in the process of manufacturing the anisotropic conductive film 1, the groove-like concave portions 15 extending in the X-direction are formed in the first resin layer 5 having the conductive particles 3 transferred and attached thereto, as shown in FIG. 7. As the concave portions 15 are formed, the convex portions 14 extending in the X-direction are also formed in the first resin layer 5.

That is, as shown in FIG. 7, the first resin layer 5 of the anisotropic conductive film 1 according to this embodiment has a structure in which portions 5a between the conductive particles 3 in the X-direction are thinner than portions 5b between the conductive particles 3 in the Y-direction. The clearances 16 are located at the portions 5a. The second resin layer 8 enters the clearances 16 formed between the conductive particles 3 arranged in the concave portions 15 (see FIG. 8B). In a case where the conductive particles 3 are joined in series before the first resin film 4 is uniaxially stretched, if the first resin film 4 is stretched to a length twice the original length thereof or is stretched 200%, a space equivalent to one conductive particle 3 is formed between each two conductive particles 3 since most of the conductive particles 3 have roughly the same size and are linearly arranged in contact with one another. This space equivalent to one conductive particle 3 is a clearance 16 as a void in the first resin layer 5.

As described above, in this embodiment, the anisotropic conductive film 1 is formed in the following manner: the first resin film 4 having the conductive particles 3 transferred and attached to the first resin layer 5 is uniaxially stretched to a length greater than at least 150% of the original length thereof in a direction other than the direction perpendicular to the array direction of the conductive particles 3, and the second resin film 7 including the second resin layer 8 is laminated on the first resin film 4. Accordingly, as shown in FIG. 9, the conductive particles 3 are regularly arranged in substantially straight lines so as to extend in the first direction (the X-direction) in the concave portions 15, and are held between the first resin layer 5 and the second resin layer 8. The conductive particles 3 may be arranged at predetermined intervals. Accordingly, in the anisotropic conductive film 1 compatible with narrower pitch, the positions of the conductive particles 3 that are uniformly dispersed can be certainly controlled, and conduction between narrow-pitched terminals can be provided without fail. The above wording "arranged in substantially straight lines" means that the conductive particles 3 are arranged so that misalignment of each row of the conductive particles 3 in the width direction (the Y-direction) of the concave portions 15 falls within a range of ⅓ or shorter of the particle size.

[Connected Structure]

Figure 10:
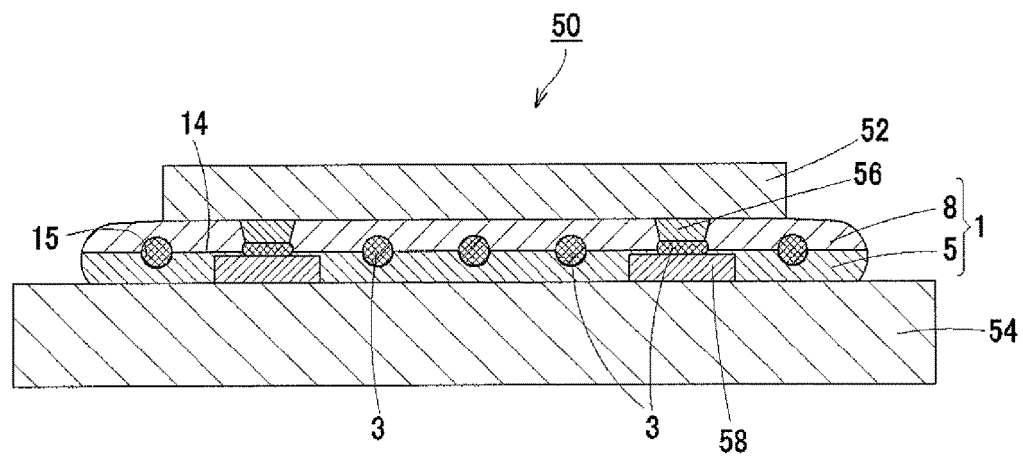
FIG. 10 is a schematic cross-sectional view of a connected structure in which the anisotropic conductive film according to the first embodiment of the present invention is used.

Next, the structure of a connected structure according to the first embodiment of the present invention is described, with reference to drawings. FIG. 10 is a schematic cross-sectional view of a connected structure in which an anisotropic conductive film according to the first embodiment of the present invention is used. A connected structure 50 according to the first embodiment of the present invention is formed by electrically and mechanically connecting and securing an electronic component 52 such as an IC chip onto a substrate 54 such as a flexible wiring board or a liquid crystal panel via the above described anisotropic conductive film 1, as shown in FIG. 10, for example. Bumps 56 as connecting terminals are attached to the electronic component 52. Meanwhile, on the upper surface of the substrate 54, electrodes 58 are formed in opposite positions to the bumps 56.

The anisotropic conductive film 1 serving as an adhesive agent according to this embodiment is interposed between the bumps 56 of the electronic component 52 and the electrodes 58 formed on the substrate 54, and between the electronic component 52 and the wiring board 54. At the sites where the bumps 56 are opposite to the electrodes 58, the conductive particles 3 contained in the anisotropic conductive film 1 are pressed and flattened, and electrical conduction is provided. At the same time, by virtue of the adhesive constituent in the anisotropic conductive film 1, the electronic component 52 and the substrate 54 are mechanically joined to each other.

As described above, in the connected structure 50 according to this embodiment, the substrate 54 having the electrodes 58 formed thereon and the electronic component 52 having the bumps 56 are connected by the anisotropic conductive film 1 that achieves a high adhesive strength in a stress-relaxed state. That is, the anisotropic conductive film 1 according to this embodiment is used in connecting the electronic component 52 and the substrate 54 of the connected structure 50.

As described above, in the anisotropic conductive film 1 according to an embodiment of the present invention, the convex portions 14 and the concave portions 15 are formed in the first resin layer 5, the conductive particles 3 are regularly arranged in the concave portions 15, the second resin layer 8 is laminated on the first resin layer 5, and the conductive particles 3 are held between the two resin layers 5 and 8. The regularly-arranged conductive particles 3 may be arranged at predetermined intervals. With this arrangement, the convex portions 14 certainly prevent the respective conductive particles 3 from moving horizontally in FIG. 10, and the conductive particles 3 are dispersed and held. Accordingly, the movement of the conductive particles 3 at the time of joining depends on the voids or the clearances 16 between the conductive particles 3, and is greatly governed by the shapes of the clearances 16.

Thus, good connectivity between the substrate 54 and the electronic component 52 can be secured in the connected structure 50, and electrical and mechanical connection reliability can be improved over a long period of time. That is, with the use of the anisotropic conductive film 1 of this embodiment, the connected structure 50 with high conduction reliability can be manufactured. Specific examples of connected structures 50 according to this embodiment include a semiconductor device, a liquid crystal display, an LED lighting system, and the like.

Second Embodiment

By a method for manufacturing an anisotropic conductive film 1 according to a second embodiment of the present invention, a sheet and a guide body are used when conductive particles are buried and arranged in grooves in the sheet. The sheet serves as a mold that is designed to have the grooves with a depth smaller than the particle size of the conductive particles, so as to improve the efficiency of transfer and attachment of the conductive particles to a resin layer without any damage to the conductive particles. The guide body has protruding portions that are formed at predetermined intervals on the surface to be in contact with the conductive particles, and can guide the conductive particles into the grooves.

Figure 11A:
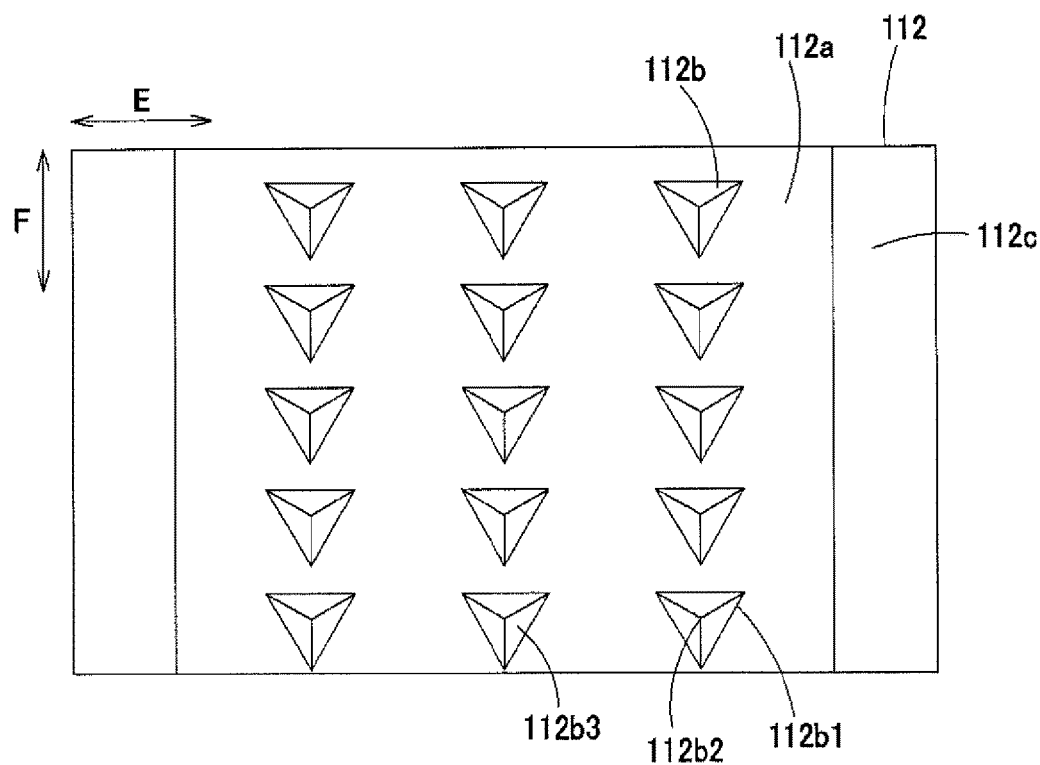
FIGS. 11A and 11B are diagrams schematically showing the structure of a guide body used by a method for manufacturing an anisotropic conductive film according to a second embodiment of the present invention.
Figure 11B:
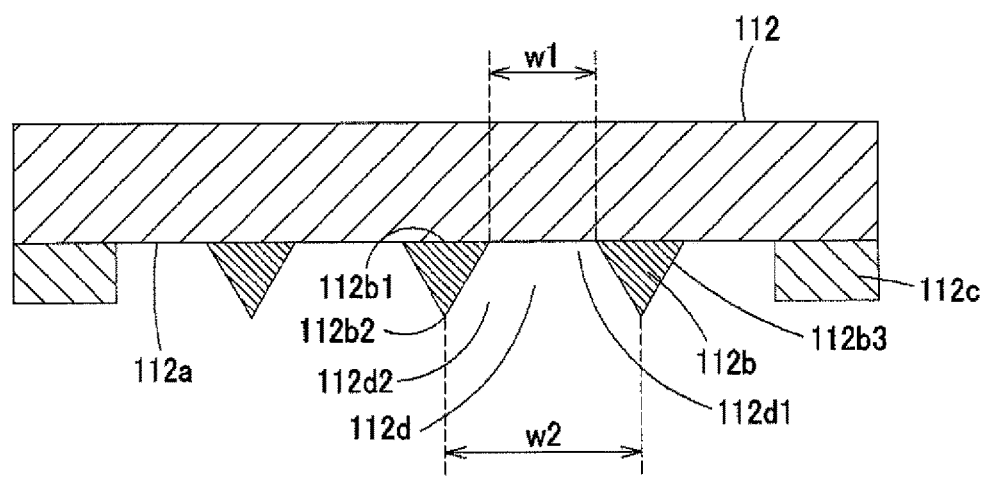
Figure 12:
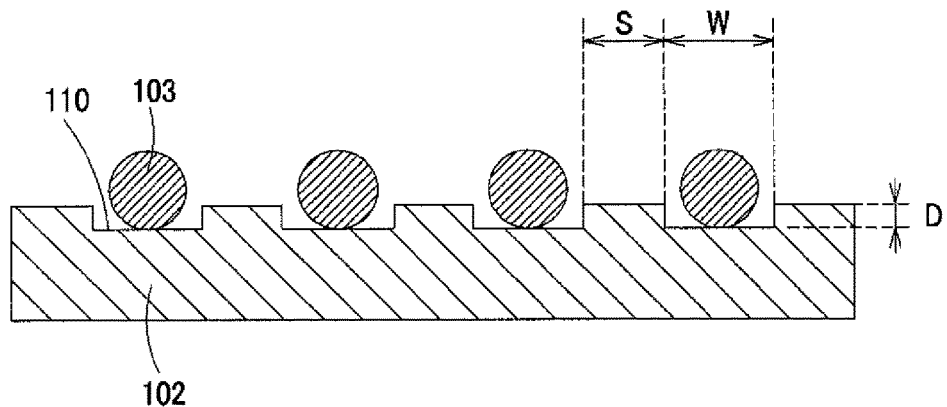
FIG. 12 is a schematic cross-sectional view showing the structure of a sheet used by the method for manufacturing an anisotropic conductive film according to the second embodiment of the present invention.
Figure 13:
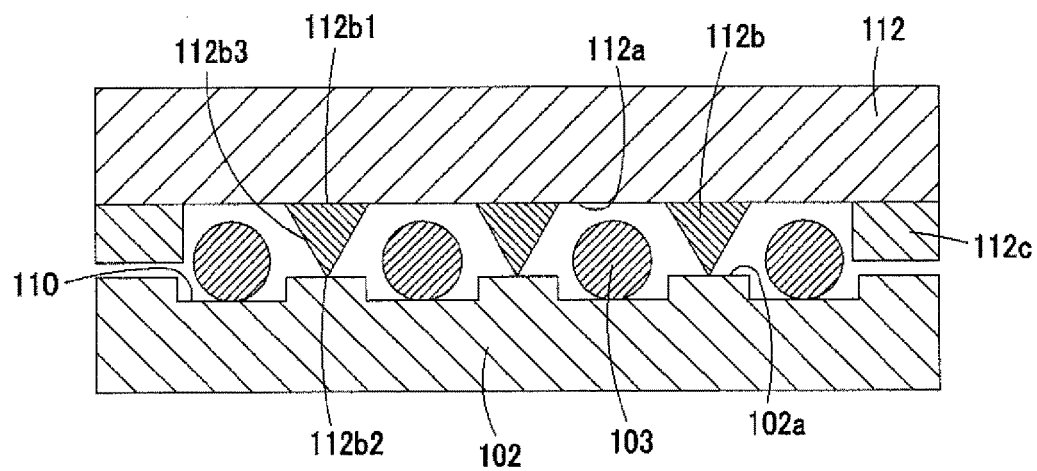
FIG. 13 is a cross-sectional view for explaining an operation to bury and arrange conductive particles in grooves in the sheet by the method for manufacturing an anisotropic conductive film according to the second embodiment of the present invention.

The method for manufacturing an anisotropic conductive film 1 according to the second embodiment of the present invention is described below, with reference to drawings. FIGS. 11A and 11B are schematic diagrams showing the structure of the guide body used by the method for manufacturing an anisotropic conductive film 1 according to the second embodiment of the present invention. FIG. 12 is a cross-sectional view schematically showing the structure of the sheet used by the method for manufacturing an anisotropic conductive film 1 according to the second embodiment of the present invention. FIG. 13 is a cross-sectional view for explaining an operation to bury and arrange the conductive particles in the grooves in the sheet by the method for manufacturing an anisotropic conductive film 1 according to the second embodiment of the present invention. FIG. 11A schematically shows the contact surface side of the guide body to be in contact with the conductive particles, the contact surface side being the characteristic portion of the guide body used in the second embodiment of the present invention. FIG. 11B schematically shows a cross-section of the guide body used in the second embodiment of the present invention. FIG. 13 is a cross-sectional view showing an operating state where the conductive particles are buried and arranged in the grooves in the sheet.

As shown in FIG. 11A, the guide body 112 used in this embodiment has protruding portions 112b formed at predetermined intervals in the width direction of the guide body 112 or in the E-direction shown in FIG. 11A on the contact surface 112a to be in contact with conductive particles 103. The protruding portions 112b can guide the conductive particles 103 into grooves 110 (see FIG. 12) of a sheet 102. Also, as shown in FIG. 11A, the protruding portions 112b are arranged at predetermined intervals so as to extend in the length direction of the contact surface 112a of the guide body 112 or in the F-direction shown in FIG. 11A. The guide body 112 may be manufactured by almost the same method as the method for manufacturing the sheet 102, and the material of the guide body 112 can be the same as the material of the sheet 102.

So as to readily spread moving conductive particles 103 when the grooves 110 in the sheet 102 are filled with the conductive particles 103, each of the protruding portions 112b has the shape of a nearly trigonal pyramid that is tapered from a base portion 112b1 on the contact surface side toward a tip portion 112b2, as shown in FIG. 11B. As each of the protruding portions 112b is tapered from the base portion 112b1 toward the tip portion 112b2, the conductive particles 103 moving on the contact surface 112a are divided by the tapered surfaces 112b3 of the respective protruding portions 112b when the guide body 112 is moved in the length direction (the F-direction) to fill the grooves 110 in the sheet 102 with the conductive particles 103. With the use of the guide body 112 having the protruding portions 112b, the conductive particles 103 can be readily guided into the grooves 110. The shape of each protruding portion 112b is not limited to a nearly trigonal pyramid, as long as it is a shape that is tapered from the base portion 112b1 toward the tip portion 112b2. For example, each protruding portion 112b may have any other shape such as a conical shape or a truncated cone shape. The shape of each protruding portion 112b is not limited to a shape formed only with straight lines, and may be partially or entirely formed with a curved line.

Also, at the hem portions of the contact surface 112a of the guide body 112, sidewall portions 112c with a height that is substantially the same as or is slightly smaller than the height of the protruding portions 112b are formed, as shown in FIG. 11B. As the sidewall portions 112c are formed at the hem portions of the contact surface 112a of the guide body 112, the conductive particles 103 can be prevented from leaking out of the contact surface 112a of the guide body 112 when the filling with the conductive particles 103 is performed with the guide body 112. Accordingly, the efficiency of filling with the conductive particles 103 becomes higher.

Furthermore, the protruding portions 112b are formed at predetermined intervals in the width direction (the E-direction) of the guide body 112 as described above, and clearance portions 112d are formed between the protruding portions 112b. The interval between the protruding portions 112b in the width direction of the guide body 112 is the interval between the base portions 112b1 of the protruding portions 112b, as shown in FIG. 11B. That is, the width W1 of the base portion 112d1 of each clearance portion 112d is substantially the same as the width W of each groove 110 in the sheet 102 (see FIG. 12). Accordingly, the guide body 112 has a structure in which the interval between the tip portions 112b2 of the protruding portions 112b, or the width W2 of the tip portion 112d2 of each clearance portion 112d, is greater than the width W of each groove 110 in the sheet 102.

As the guide body 112 has the above described structure, the conductive particles 103 introduced between the protruding portions 112b are divided by the tapered surfaces 112b3 of the protruding portions 112b of the guide body 112 when the grooves 110 in the sheet 102 are filled with the conductive particles 103 with the use of the guide body 112. The divided conductive particles 103 are then guided into the clearance portions 112d located between the protruding portions 112b, flow in the length direction (the F-direction) of the contact surface 112a of the guide body 112, and are guided into the grooves 110 in the sheet 102. Accordingly, when the conductive particles 103 are buried and arranged in the grooves 110 in the sheet 102, the conductive particles 103 can be readily guided into the grooves 110 in the sheet 102, and the efficiency of filling the grooves 110 in the sheet 102 becomes higher.

In this embodiment, the sheet 102 having the grooves 110 with a depth D that is smaller than the particle size of the conductive particles 103 is used, as shown in FIG. 12. Specifically, the grooves 110 with the depth D that is approximately ⅓ to ½ of the size of the conductive particles 103 are formed in the sheet 102. The width W of the grooves 110 is substantially the same as or slightly greater than the particle size of the conductive particles 103. As described above, the grooves 110 have the depth D that is smaller than the particle size of the conductive particles 103, and have the width W that is substantially the same as or slightly greater than the particle size of the conductive particles 103. As this sheet 102 is used, the area to be in contact with a resin layer 105 when the conductive particles 103 are transferred and attached to the resin layer 105 included in a first resin film 104 (see FIG. 14) is increased, and accordingly, the efficiency of transfer and attachment of the conductive particles 103 becomes higher. Also, as the grooves 110 in the sheet 102 are designed to be shallow, extra stress is not applied to the conductive particles 103 when the conductive particles 103 are transferred and attached to the resin layer 105. Accordingly, the conductive particles 103 are not easily damaged.

As described above, in this embodiment, the sheet 102 having the grooves 110 with the depth D that is smaller than the particle size of the conductive particles, and the guide body 112 having the protruding portions 112b that can guide the conductive particles 103 into the grooves 110 in the sheet 102 and are formed at predetermined intervals on the contact surface 112a to be in contact with the conductive particles 103 are used when the conductive particles 103 are buried and arranged in the grooves 110 in the sheet 102. Specifically, when the conductive particles 103 are buried and arranged in the grooves 110 in the sheet 102, the tip portions 112b2 of the protruding portions 112b of the guide body 112 are brought into contact with interval portions 102a existing between the grooves 110 of the sheet 102, as shown in FIG. 13. While the guide body 112 is moved in the length direction (the A-direction shown in FIG. 2) of the sheet 102, the grooves 110 are filled with the conductive particles 103.

That is, in this embodiment, the grooves 110 in the sheet 102 are filled with the conductive particles 103, while the conductive particles 103 are arranged in the grooves 110 with the use of the guide body 112 having the protruding portion 112b formed on the contact surface 112a. At this point, the extra amount of conductive particles 103 filling the grooves 110 in the sheet 102 is removed by the protruding portions 112b of the guide body 112. Accordingly, even with the use of the sheet 102 having the shallow grooves 110, the necessary amount of conductive particles 103 can be arranged in the grooves 110.

Also, as the sheet 102 having the grooves 110 with the depth D smaller than the particle size of the conductive particles 103 and the guide body 112 having the protruding portions 112b formed on the contact surface 112a are used in this embodiment, the efficiency of transfer and attachment of the conductive particles 103 to the resin layer 105 can be improved without damage to the conductive particles 103. Accordingly, the quality of an anisotropic conductive film 101 can be improved while the efficiency of production of the anisotropic conductive film 101 is improved.

Figure 14:
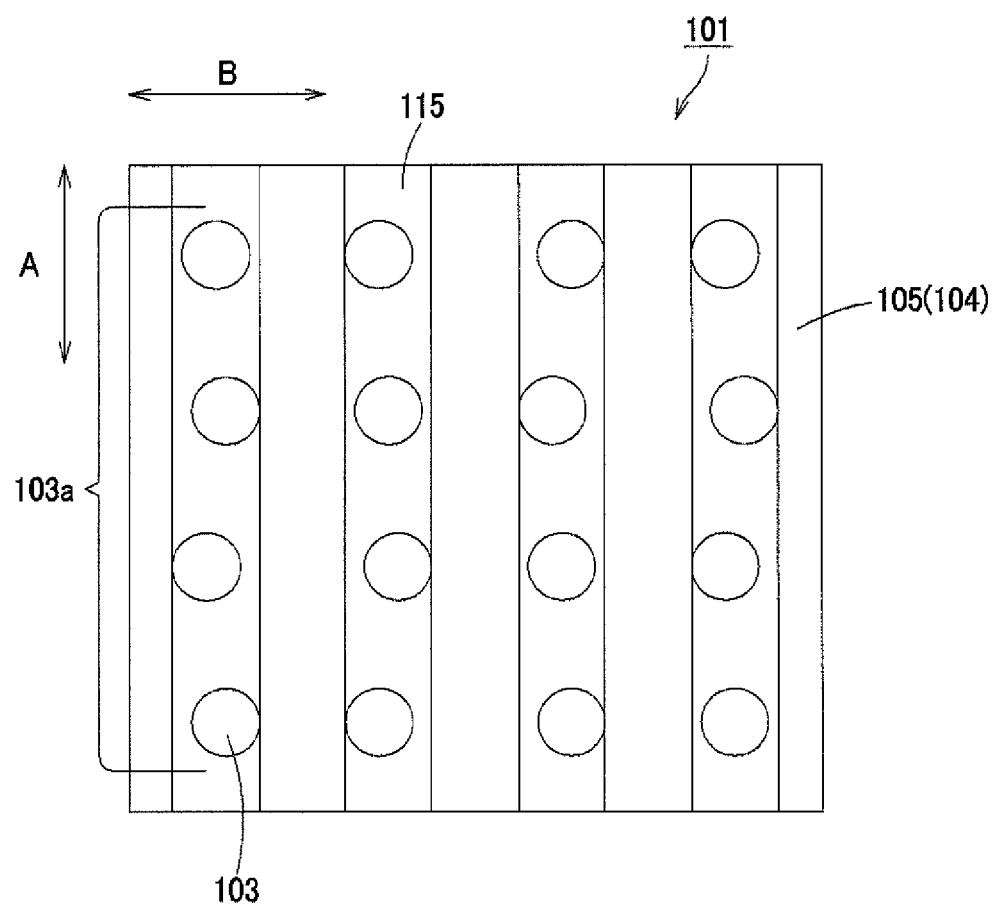
FIG. 14 is a plan view showing an arranged state of the conductive particles in an anisotropic conductive film manufactured by the method for manufacturing an anisotropic conductive film according to the second embodiment of the present invention.

Since the sheet 102 having the shallow grooves 110 is used when the conductive particles 103 are transferred and attached to the resin layer 105 of the first resin film 104 in this embodiment, the conductive particles 103 not tightly secured in the grooves 110 are transferred and attached to the resin layer 105. Therefore, as shown in FIG. 14, in particle rows 103a extending in the first direction (the A-direction shown in FIG. 14) that is the length direction of the anisotropic conductive film 101 in the resin layer 105, the conductive particles 103 are misaligned with one another in the width direction (the B-direction) of concave portions 115 formed in the resin layer 105. Specifically, the conductive particles 103 are arranged randomly in the width direction so that the misalignment of the conductive particles 103 falls within a range of 1.5 times the particle size, as shown in FIG. 14.

Third Embodiment

By a method for manufacturing an anisotropic conductive film according to a third embodiment of the present invention, a sheet that has grooves as gaps between electrodes, and a squeegee that has conductive properties are used so as to improve the efficiency of filling the grooves in the sheet when conductive particles are buried and arranged in the grooves in the sheet.

Figure 15A:
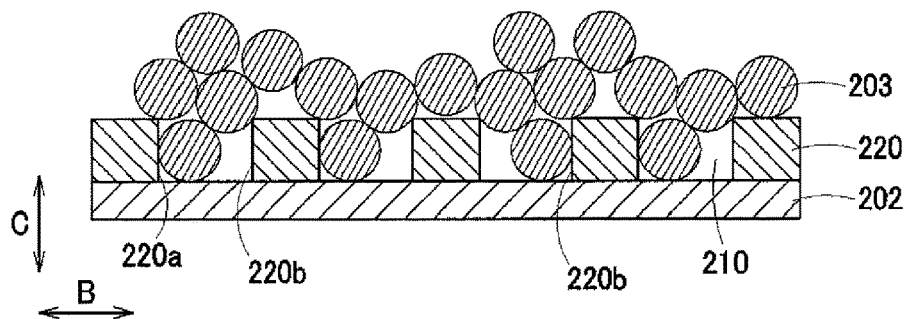
FIGS. 15A through 15C are cross-sectional views showing the procedures for filling grooves with conductive particles by a method for manufacturing an anisotropic conductive film according to a third embodiment of the present invention.
Figure 15B:
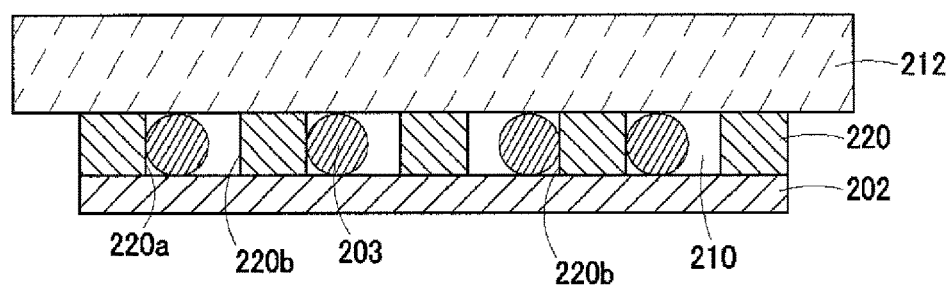
Figure 15C:
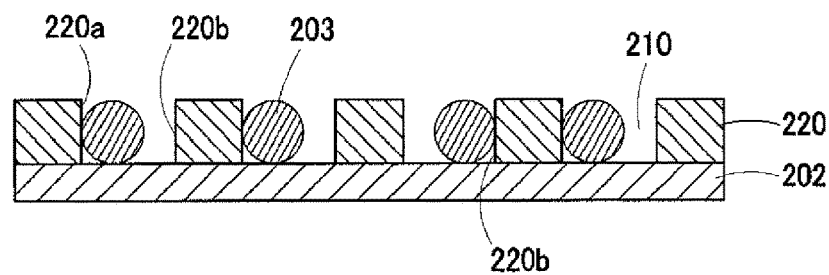
Figure 16:
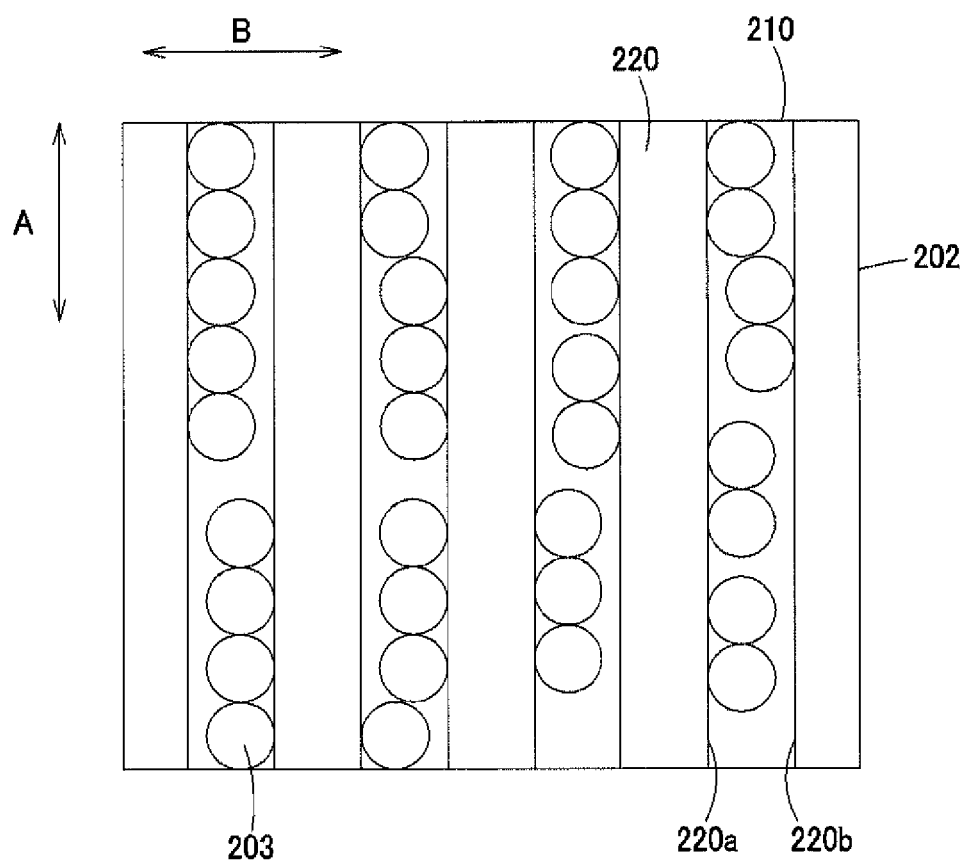
FIG. 16 is a plan view showing an arranged state of the conductive particles in the sheet after the filling procedures carried out by the method for manufacturing an anisotropic conductive film according to the third embodiment of the present invention.

The method for manufacturing an anisotropic conductive film according to the third embodiment of the present invention is described below, with reference to drawings. FIGS. 15A through 15C are cross-sectional views showing the procedures for filling grooves with conductive particles by a method for manufacturing an anisotropic conductive film according to the third embodiment of the present invention. FIG. 16 is a plan view showing the arranged state of the conductive particles on a sheet after the end of the filling procedures by the method for manufacturing the anisotropic conductive film according to the third embodiment of the present invention.

In this embodiment, so as to improve the efficiency of filling grooves 210 of a sheet 202, the gaps between electrodes 220 that extend in the length direction (the A-direction shown in FIG. 16) of the sheet 202 and are formed at predetermined intervals on the sheet 202 are regarded as the grooves 210 to be filled with conductive particles 203, and each of the electrodes 220 is made to generate magnetic force. As shown in FIGS. 15A through 15C, in the sheet 202 formed with a substrate, the electrodes 220 extending in the length direction (the A-direction) of the sheet 202 are formed at predetermined intervals in the width direction (the B-direction shown in FIG. 16) of the sheet 202.

Each of the electrodes 220 is made to generate magnetic force by current application or the like. As a result, the conductive particles 203 are attracted to the electrodes 220, and the conductive particles 203 can be placed in substantially straight lines in the grooves 210 existing between the electrodes. In this embodiment, the strength of the magnetic force generated from the electrodes 220 is adjusted, so that transfer of the conductive particles 203 can be controlled as appropriate. Alternatively, the magnetic force acting on the conductive particles 203 may be adjusted as appropriate by placing the conductive particles 203 between the electrodes 220 with certain magnetic force and then applying higher magnetic force to the opposite surface of the transfer member at the time of the transfer, instead of adjusting the magnetic force generated from the electrodes 220.

In this embodiment, a squeegee 212 for filling the grooves 210 with the conductive particles 203 is provided. The squeegee 212 is moved in the length direction (the A-direction shown in FIG. 16) of the electrodes 220 while in contact with the respective electrodes 220, so that the respective grooves 210 are filled with the conductive particles 203 while the extra conductive particles 203 adhering to the top surfaces of the electrodes 220 are removed. In this embodiment, the squeegee 212 made of a material such as a metal having conductive properties is characteristically used, so as to maintain the magnetic force generated from the electrodes 220. The material of the squeegee 212 is not particularly limited, as long as the material is a metal or the like that can be electrically charged.

As described above in this embodiment, the electrodes 220 are provided on the sheet 202, and, before the grooves 210 in the sheet 202 are filled with the conductive particles 203, magnetic force is generated between the electrodes 220 in the C-direction (see FIG. 15A) perpendicular to the length direction (the A-direction shown in FIG. 16) and the width direction (the B-direction) of the electrodes 210.

As each electrode 220 is made to generate magnetic force in this embodiment, extra stress is not applied to the conductive particle 203, and the conductive particles 203 can certainly adhere to the electrodes 220. The grooves 210 existing between the electrodes 220 are then filled with the conductive particles 203 adhering to these electrodes 220, as shown in FIG. 15A. Also, in this embodiment, the electrodes 220 are made to generate magnetic force to attach the conductive particles 203 to the electrodes 220. As a result, the conductive particles 203 filling the grooves 210 each adhere to a side wall 220a or 220b of the electrodes 220 forming the sidewalls of the grooves 210, as shown in FIG. 15A. Therefore, after the stretching of the first resin film 204, the conductive particles 203 each adhere to one side of a groove.

After the conductive particles 203 are made to adhere to the respective electrodes 220, the extra conductive particles 203 adhering to the top surfaces of the electrodes 220 are removed with the squeegee 212, as shown in FIG. 15B. In this embodiment, the plating or the like on the surfaces of the conductive particles 203 might be slightly damaged when the extra conductive particles 203 are removed with the squeegee 212, but the damage is not so serious as to adversely affect the properties such as conduction reliability of the completed anisotropic conductive film 201. After the extra conductive particles 203 are removed with the squeegee 212, and the necessary conductive particles 203 are arranged, the filling of the grooves 210 in the sheet 202 with the conductive particles 203 is completed as shown in FIG. 15C.

As described above, in this embodiment, the sheet 202 having the grooves 210 formed with the gaps between the electrodes 220 is used, so that the electrodes 220 are made to generate magnetic force by current application or the like, and the conductive particles 203 not subjected to extra stress are attracted to the electrodes 220 by virtue of the generated magnetic force. While the extra conductive particles 203 are removed with the squeegee 212 having conductive properties, the grooves 210 are filled with the conductive particles 203. The conductive particles 203 filling the grooves 210 in the sheet 202 are then transferred and attached to the first resin film 204 (see FIG. 17). Accordingly, the grooves 210 in the sheet 202 can be efficiently and effectively filled with the conductive particles 203 before the conductive particles 203 are transferred and attached to the first resin film 204. That is, as the electrodes 220 provided on the desired sheet 202 are made to generate magnetic force, the efficiency of filling the grooves 210 in the sheet 202 to be used at the time of transfer and attachment of the conductive particles 203 can be improved. Particularly, as the grooves 210 in the sheet 202 are efficiently and effectively filled with the conductive particles 203 in this embodiment, this embodiment can be applied in a case where anisotropic conductive films longer than those of the first and second embodiments are efficiently manufactured.

Figure 17:
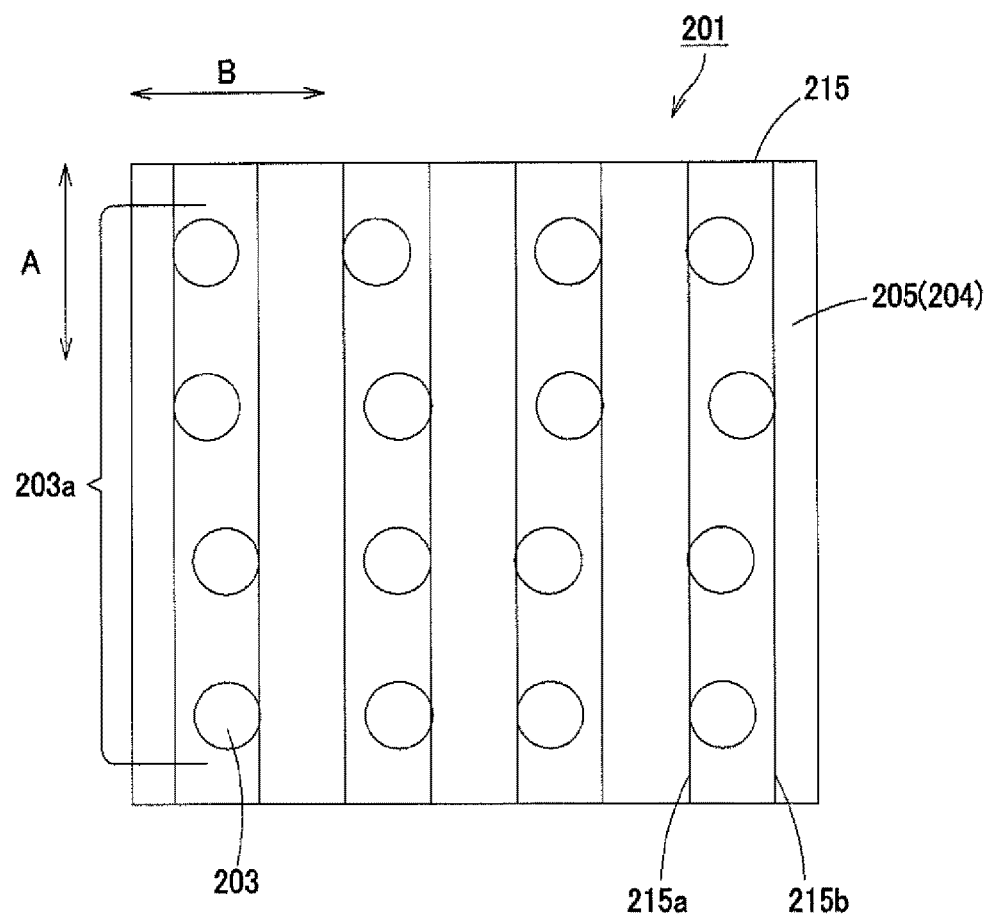
FIG. 17 is a plan view showing an arranged state of the conductive particles in an anisotropic conductive film manufactured by the method for manufacturing an anisotropic conductive film according to the third embodiment of the present invention.

Also, in this embodiment, the conductive particles 203 filling the grooves 210 in the sheet 202 each adhere to a sidewall 220a or 220b of the electrodes 220, as shown in FIG. 16, and are held between the electrodes. Accordingly, when the first resin film 204 is uniaxially stretched in the length direction (the A-direction) after the conductive particles 203 filling the grooves 210 in the sheet 202 are transferred and attached to a resin layer 205 of the first resin film 204, the conductive particles 203 each adhere to a side rim portion 215a or 215b of concave portions 215 formed in the resin layer 205, as shown in FIG. 17. That is, in each particle row 203a in the anisotropic conductive film 201 of this embodiment, each conductive particle 203 adheres to the side rim portion 215a or 215b of each corresponding concave portion 215 formed in the resin layer 205. Misalignment of the conductive particles 203 in each particle row 203a in the width direction (the B-direction) of the anisotropic conductive film 201 is affected by the width W of the grooves 210. Therefore, in a case where the particle size of the conductive particles 203 is 3.0 μm, and the groove width is 3.5 to 4.0 μm, the misalignment is approximately ⅓ of the particle size.

In the above described case, the conductive particles 203 are pressed against the electrodes 220 and the squeegee 212 in a sliding manner, and might have damage due to sliding and contact. In a case where the conductive particles 203 are plated particles, for example, the surfaces of the conductive particles 203 partially come off or peel. In a case where the conductive particles 203 are metal particles, the conductive particles 203 might be partially deformed. The damage due to sliding and contact accounts for 5% or more of the outer surfaces of the conductive particles 203, so that the movement of the conductive particles 203 is restrained at the time of transfer to the binder resin and at the time of heat and pressure application to the anisotropic conductive film 201. As long as conductive particles 203 having the damage due to sliding and contact account for 50% or less of the total amount of the conductive particles 203, the conduction properties of the anisotropic conductive film 201 are not affected. However, conductive particles 203 having the damage due to sliding and contact preferably account for 25% or less of the total amount of the conductive particles, and more preferably, less than 15% of the total amount of the conductive particles 203.

EXAMPLES

Examples Common to the First Through Third Embodiments of the Present Invention

Next, examples of the present invention are described. In the examples, sheets 2 having grooves 10 of various shapes and sizes were prepared, and conductive particles 3 were buried and arranged in each of the samples. The conductive particles 3 were transferred to first resin films 4, and second resin films 7 were laminated after uniaxial stretching of the first resin films 4. In this manner, samples of the anisotropic conductive film 1 were manufactured.

A 50-μm thick polypropylene film (Torayfan 2500H, manufactured by Toray Industries, Inc.) was used as the sheet 2 in each example. This sheet 2 was thermally pressed against a metal mold having a predetermined groove pattern formed therein at 180° C. for 30 minutes, to form grooves 10. The conductive particles 3 that were to fill and be arranged in the grooves 10 in the sheets 2 were formed by plating resin core particles with Au (AUL703, manufactured by Sekisui Chemical Co., Ltd). The conductive particles 3 were sprinkled onto the surface of each sheet 2 on the side of the grooves 10, and were buried and arranged uniformly in the grooves 10 with a squeegee made of Teflon (a registered trade name).

As for the first resin films 4 to be laminated on the sheets 2 having the conductive particles 3 arranged thereon and the second resin films 7 to be laminated on the first resin films 4, a binder resin composition was formed by mixing and dispersing 50 parts of a microcapsule-type amine-based hardener (NOVACURE HX3941HP, manufactured by Asahi Kasei E-materials Corporation), 14 parts of a liquid epoxy resin (EP828, manufactured by Mitsubishi Chemical Corporation), 35 parts of a phenoxy resin (YP50, manufactured by Nippon Steel Chemical Co., Ltd.), and 1 part of a silane coupling agent (KBE403, manufactured by Shin-Etsu Chemical Co., Ltd.). For each first resin film 4, the binder resin composition was applied onto an unstretched polypropylene film (Torayfan NO3701J, manufactured by Toray Industries, Inc.), to form a 5-μm thick layer. For each second resin film 7, the binder resin composition was applied onto an unstretched polypropylene film (Torayfan NO3701J, manufactured by Toray Industries, Inc.), to form a 15-μm thick layer. In this manner, sheet-type thermo-setting resin films each having a resin layer 5 or 8 formed on an entire surface were formed. The size of the first resin films 4 until the transfer before the stretching was 20×30 cm, which was approximately the same as the A4 paper size. Such first resin films 4 were used in manufacturing the samples of the anisotropic conductive film 1.

The first resin films 4 were bonded to the sheets 2 having the conductive particles 3 buried and arranged in the grooves 10, so that the conductive particles 3 were transferred and attached to the resin layers 5 of the first resin films 4. The first resin films 4 were then uniaxially stretched 200% in an oven at 130° C., with the use of a stretching machine of a pantograph type. After the stretching, the second resin films 7 were bonded to the first resin films 4 on the side of the resin layers 5 having the conductive particles 3 transferred and attached thereto, to form the samples of the anisotropic conductive film 1. In each example, 20,000/mm² is a target for the particle density, and this particle density was set for comparing influences of the shapes of the sheets 2 serving as the transfer molds and the orientation of the stretching, and clarifying the advantageous effects and features of the present invention. Therefore, the optimum stretch rate varies with purposes of use of the anisotropic conductive film 1, and so does the optimum particle density.

As for each sample of the anisotropic conductive film 1, the particle density, the proportion of joined particles, and the variation σ in the particle density were measured. With each of the samples of the anisotropic conductive film 1, a connected structure sample in which bumps of an IC chip were connected to electrode terminals of a wiring board was manufactured, and the rate of short-circuiting between adjacent electrode terminals was measured.

In Example 1, conductive particles 3 of 3 μm in particle size were used. The grooves 10 formed in the sheet 2 had a pattern extending in the longitudinal direction of the sheet 2 (see FIG. 3A), had a rectangular shape in cross-section (see FIG. 4A), had a width W of 3.0 μm, had a depth D of 3.0 μm, and were arranged at intervals S of 5.0 μm.

Example 2 was the same as Example 1, except that the width W of the grooves 10 was 5.9 μm.

Example 3 was the same as Example 1, except that the width W of the grooves 10 was 3.5 μm, and the depth D was 1.5 μm.

Example 4 was the same as Example 3, except that the depth D of the grooves 10 was 4.5 μm.

Example 5 was the same as Example 1, except that the width W of the grooves 10 was 6.5 μm.

Example 6 was the same as Example 3, except that the depth D of the grooves 10 was 6.0 μm.

In Example 7, conductive particles 3 of 4.0 μm in particle size (AUL704, manufactured by Sekisui Chemical Co., Ltd.) were used. The other conditions were the same as those in Example 1, except that the grooves 10 formed in the sheet 2 had a width W of 4.0 μm and a depth D of 4.0 μm.

In Example 8, the grooves 10 formed in the sheet 2 had a triangular shape in cross-section (see FIG. 4J), had a width W of 3.0 μm, had a depth D of 3.0 μm, and were arranged at intervals S of 5.0 μm. The other conditions for the conductive particles 3 and the pattern of the grooves 10 were the same as those in Example 1.

In Comparative Example 1, an anisotropic conductive film was formed by a conventional manufacturing method.

Specifically, 5 parts by mass of conductive particles 3 that were formed by plating resin core particles with Au and were 3 μm in particle size (AUL703, manufactured by Sekisui Chemical Co., Ltd.) were dispersed in the binder resin composition according to the above described examples, and the resultant material was applied onto an unstretched polypropylene film (Torayfan NO3701J, manufactured by Toray Industries, Inc.), to form a 20-μm thick layer. In this manner, a sheet-type thermo-setting resin film having a resin layer formed on an entire surface was formed.

Each IC chip connected to a wiring board via an anisotropic conductive film according to one of the examples or the comparative example was 1.4 mm×20.0 mm in size, 0.2 mm in thickness, 17 μm×100 μm in gold bump size, 12 μm in bump height, and 11 μm in bump interval.

The wiring board on which this IC chip was to be mounted was a glass substrate (1737F, manufactured by Corning Incorporated) in which an aluminum wiring pattern corresponding to the pattern in the IC chip was formed. This wiring board was 50 mm×30 mm in size and 0.5 mm in thickness.

The conditions for connecting the IC chip and the glass substrate via an anisotropic conductive film according to one of the examples or the comparative example were 170° C., 80 MPa, and 10 seconds.

The particle density in each of the anisotropic conductive films according to the examples and the comparative example was measured by counting the number of conductive particles 3 per 1 mm$^2$ with the use of a microscope. The proportion of joined particles was measured by counting the number of conductive particles 3 joined to two or more conductive particles 3 in an area of 200 μm×200 μm=40,000 μm$^2$ with the use of a microscope, and calculating an average number of joined conductive particles 3. Further, the variation σ in the particle density in an area of 50 μm×50 μm=2,500 μm$^2$ was calculated.

The rate of short-circuiting between adjacent electrode terminals in each connected structure sample was also measured.

The results of the measurement carried out on the anisotropic conductive films of Examples 1 through 8 and the comparative example are collectively shown in Table 1.

TABLE 1

Figure 4A:
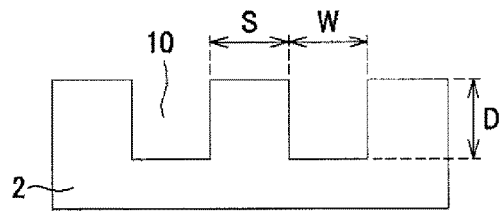
FIGS. 4A through 4J are cross-sectional views showing various shapes of grooves in sheets.
Figure 4F:
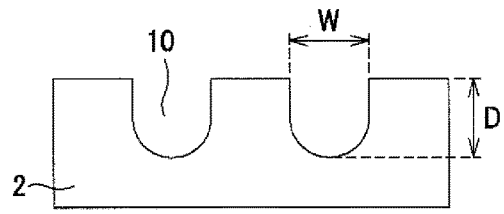
Figure 4B:
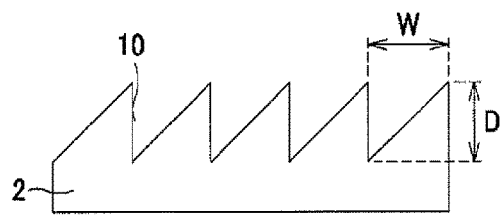
Figure 4G:
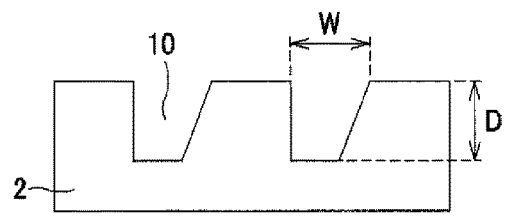
Figure 4C:
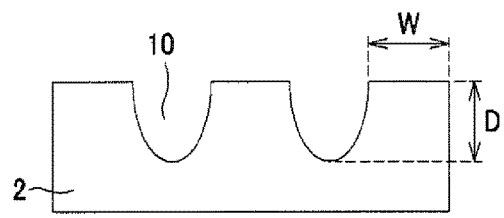
Figure 4H:
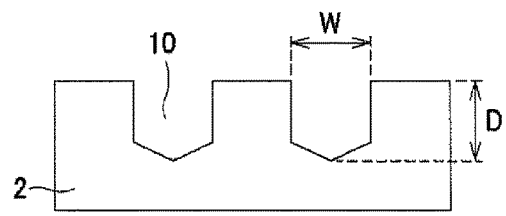
Figure 4D:
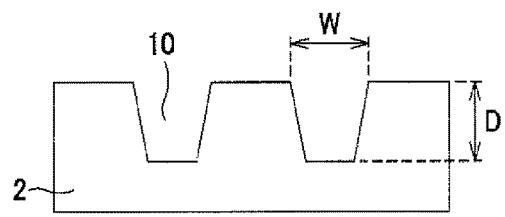
Figure 4I:
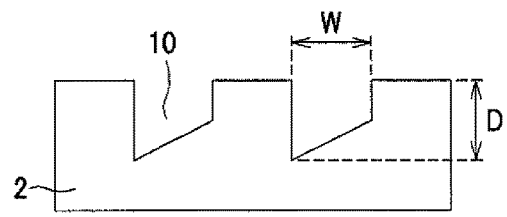
Figure 4E:
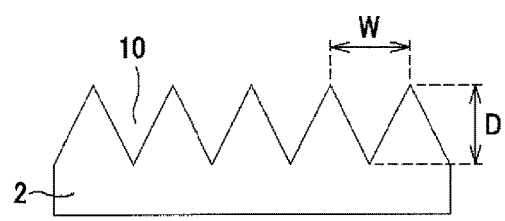
Figure 4J:
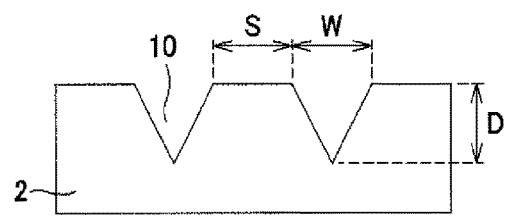

|  |  | Example 1 | Example 2 | Example 3 | Example 4 | Example 5 | Example 6 | Example 7 | Example 8 | Comparative Example 1 |
|---|---|---|---|---|---|---|---|---|---|---|
| Arrangement status of conductive particles |  | arranged | arranged | arranged | arranged | arranged | arranged | arranged | arranged | random |
| Particle size of conductive particles (μm) |  | 3 | 3 | 3 | 3 | 3 | 3 | 4 | 3 | 3 |
| Shape of grooves | Shape | FIG. 4A | FIG. 4A | FIG. 4A | FIG. 4A | FIG. 4A | FIG. 4A | FIG. 4A | FIG. 4J |  |
|  | W (μm) | 3.0 | 5.9 | 3.5 | 3.5 | 6.5 | 3.5 | 4.0 | 3.0 |  |
|  | D (μm) | 3.0 | 3.0 | 1.5 | 4.5 | 3.0 | 6.0 | 4.0 | 3.0 |  |
|  | S (μm) | 5.0 | 5.0 | 5.0 | 5.0 | 5.0 | 5.0 | 5.0 | 5.0 |  |
| Particle density (number of particles/mm$^2$) |  | 16500 | 12900 | 15700 | 16700 | 13000 | 18000 | 14600 | 15600 | 20000 |
| Average proportion of joined particles (%) |  | 0 | 3 | 2 | 5 | 8 | 9 | 0 | 0 | 12 |
| Variation σ in particle density |  | 1.7 | 1.8 | 1.7 | 1.6 | 1.8 | 1.6 | 1.7 | 1.7 | 10.2 |
| Short-circuit rate (%) |  | 0 | 0 | 0 | 0 | 0 | 0 | 0 | 0 | 2 |

As shown in Table 1, in each of Examples 1 through 8, the conductive particles 3 were arranged beforehand in a predetermined pattern in the sheet 2, and the conductive particles 3 were effectively dispersed when the first resin film 4 having the conductive particles 3 transferred and attached thereto was uniaxially stretched. Accordingly, in each of the anisotropic conductive films of Examples 1 through 8, the proportion of joined particles was 9% or lower. Also, in each of the anisotropic conductive films of Examples 1 through 8, the density of the conductive particles 3 was lower than 20,000/mm$^2$, and the variation (σ) in the particle density was 2 or smaller. In the connected structure samples manufactured by using these anisotropic conductive films, the rate of short-circuiting between electrode terminals was 0%.

Particularly, in each of Examples 1 through 4, the width W of the grooves 10 in the sheet 2 was equal to or greater than the particle size of the conductive particles 3 but was smaller than twice the particle size of the conductive particles 3, and the depth D of the grooves 10 was 0.5 to 1.5 times the particle size of the conductive particles 3. Accordingly, the particle density was low, and the proportion of joined particles was 5% or lower.

Meanwhile, in Comparative Example 1 using a conventional anisotropic conductive film, the particle density was 20,000/mm$^2$, and the proportion of joined particles was 12%, which was also higher than that in Examples. The variation (σ) in the particle density in the anisotropic conductive film of Comparative Example 1 was also as high as 10.2, and the rate of short-circuiting between adjacent electrode terminals was 2%.

As for the influence of the width W of the grooves 10 in the sheet 2, in a case where the width W of the grooves 10 in the sheet 2 was equal to the particle size of the conductive particles 3 as in Example 1, no joined particles were observed. However, in a case where the width W of the grooves 10 in the sheet 2 approached twice the particle size of the conductive particles 3 and exceeded twice the particle size as in Examples 2 and 5, the proportion of joined particles increased. It is considered that such increases in the proportion of joined particles are caused by dispersion of stress applied to the conductive particles 3 at the time of filling the grooves 10 in a case where the width W of the grooves 10 in the sheet 2 becomes greater. As can be seen from this, the width W of the grooves 10 in the sheet 2 is preferably smaller than twice the particle size of the conductive particles 3.

As for the influence of the depth D of the grooves 10 in the sheet 2, it is apparent from Examples 3, 4, and 6 that the particle density and the proportion of joined particles tend to increase as the depth D of the grooves 10 in the sheet 2 increases from 0.5 times the particle size of the conductive particles 3, to 1.5 times the particle size, and to twice the particle size. Particularly, it is apparent from Examples 3 and 4 that, so as to maintain conduction reliability of the anisotropic conductive film, the depth D of the grooves 10 in the sheet 2 is preferably 0.5 to 1.5 times the particle size of the conductive particles 3, because the proportion of joined particles is 5% or lower in such cases.

Examples According to the First Embodiment of the Present Invention

Next, where the stretch rate at the time of uniaxially stretching the first resin film 4 in Examples 11 through 19 described below was varied from 150% to 200% to 300% to 450% to 700%, the particle densities, the proportions of joined particles, the variations in the particle density, and the rates of short-circuiting were measured under the same conditions as those in Examples 1 through 8 described above. The influence of the width W of the grooves 10 in the sheet 2 was examined in Examples 11 through 13, the influence of the depth D of the grooves 10 in the sheet 2 was examined in Examples 14 through 16, and the influence of the interval between the grooves 10 in the sheet 2, or the distance S between particle rows, was examined in Examples 17 through 19.

In Example 11, conductive particles 3 of 3 μm in particle size were used as in Example 1 described above. The grooves 10 formed in the sheet 2 had a pattern extending in the longitudinal direction of the sheet 2 (see FIG. 3A), had a rectangular shape in cross-section (see FIG. 4A), had a width W of 3.0 μm, had a depth D of 3.0 μm, and were arranged at intervals S of 5.0 μm.

Example 12 was the same as Example 1, except that the width W of the grooves 10 was 5.9 μm as in Example 2 described above.

Example 13 was the same as Example 1, except that the width W of the grooves 10 was 6.5 μm as in Example 5 described above.

Example 14 was the same as Example 1, except that the width W of the grooves 10 was 3.5 μm and the depth D was 1.5 μm as in Example 3 described above.

Example 15 was the same as Example 3, except that the depth D of the grooves 10 was 4.5 μm as in Example 4 described above.

Example 16 was the same as Example 3, except that the depth D of the grooves 10 was 6.0 μm as in Example 6 described above.

Example 17 was the same as Example 1, except that the distance S between particle rows was 3.0 μm.

Example 18 was the same as Example 1, except that the distance S between particle rows was 6.0 μm.

Example 19 was the same as Example 1, except that the distance S between particle rows was 10.5 μm.

The results of the measurement carried out on the particle densities, the proportions of joined particles, the variations in the particle density, and the rates of short-circuiting in a case where the stretch rate at the time of uniaxially stretching the first resin film 4 in Examples 11 through 19 described above was varied from 150% to 200% to 300% to 450% to 700% are collectively shown in Table 2.

TABLE 2

| | | | Example 11 | Example 12 | Example 13 | Example 14 | Example 15 | Example 16 | Example 17 | Example 18 | Example 19 |
|---|---|---|---|---|---|---|---|---|---|---|---|
| Arrangement status of conductive particles | | | arranged | arranged | arranged | arranged | arranged | arranged | arranged | arranged | arranged |
| Particle size of conductive particles (μm) | | | 3 | 3 | 3 | 3 | 3 | 3 | 3 | 3 | 3 |
| Shape of grooves | W(μm) | | 3 | 5.9 | 6.5 | 3.5 | 3.5 | 3.5 | 3 | 3 | 3 |
| | D(μm) | | 3 | 3 | 3 | 1.5 | 4.5 | 6 | 3 | 6 | 10.5 |
| | S(μm) | | 5 | 5 | 5 | 5 | 5 | 5 | 3 | 6 | 10.5 |
| Particle density (number of particles/mm$^2$) | Stretch (%) | 150 | 23500 | 19800 | 19900 | 22700 | 23100 | 25800 | 27700 | 18900 | 13300 |
| | | 200 | 16500 | 12900 | 13000 | 15700 | 16700 | 18000 | 21700 | 14100 | 9900 |
| | | 300 | 12200 | 10400 | 10500 | 10300 | 11400 | 12500 | 14400 | 9600 | 6400 |
| | | 450 | 8500 | 7200 | 7400 | 7100 | 7700 | 8200 | 9300 | 6300 | 4900 |
| | | 700 | 5100 | 4600 | 4800 | 4500 | 5000 | 5300 | 6100 | 4800 | 2800 |
| Average proportion of joined particles (%) | Stretch (%) | 150 | 7 | 15 | 13 | 8 | 17 | 19 | 6 | 17 | 2 |
| | | 200 | 0 | 3 | 8 | 2 | 5 | 9 | 1 | 4 | 0 |
| | | 300 | 0 | 1 | 5 | 1 | 2 | 4 | 0 | 2 | 0 |
| | | 450 | 0 | 0 | 3 | 0 | 0 | 2 | 0 | 1 | 0 |
| | | 700 | 0 | 0 | 1 | 0 | 0 | 1 | 0 | 0 | 0 |
| Variation σ in particle density | Stretch (%) | 150 | 1.8 | 1.8 | 1.8 | 1.7 | 1.7 | 1.6 | 1.7 | 1.6 | 1.6 |
| | | 200 | 1.7 | 1.8 | 1.8 | 1.7 | 1.6 | 1.6 | 1.7 | 1.6 | 1.6 |
| | | 300 | 1.7 | 1.8 | 1.8 | 1.8 | 1.7 | 1.7 | 1.8 | 1.6 | 1.6 |
| | | 450 | 1.8 | 1.8 | 1.9 | 1.9 | 1.8 | 1.9 | 1.8 | 1.7 | 1.6 |

TABLE 2-continued

|  |  |  | Example 11 | Example 12 | Example 13 | Example 14 | Example 15 | Example 16 | Example 17 | Example 18 | Example 19 |
|---|---|---|---|---|---|---|---|---|---|---|---|
| Short-circuit rate (%) | Stretch (%) | 150 | 4 | 3 | 3 | 5 | 3 | 3 | 2 | 3 | 2 |
|  |  | 200 | 0 | 0 | 0 | 0 | 0 | 0 | 0 | 0 | 0 |
|  |  | 300 | 0 | 0 | 0 | 0 | 0 | 0 | 0 | 0 | 0 |
|  |  | 450 | 0 | 0 | 0 | 0 | 0 | 0 | 0 | 0 | 0 |
|  |  | 700 | 0 | 0 | 0 | 0 | 0 | 0 | 0 | 0 | 0 |

As shown in Table 2, Examples 11 through 19 confirmed that the particle density and the proportion of joined particles decreased in proportion to the degree of stretching (stretch rate). This is supposedly because the conductive particles 3 were arranged beforehand in a predetermined pattern in the sheet 2, and the conductive particles 3 were effectively dispersed when the first resin film 4 having the conductive particles 3 transferred and attached thereto was uniaxially stretched. Meanwhile, Examples 11 through 19 also confirmed that the variation (σ) in the particle density was 2 or smaller, regardless of the stretch rate.

Examples 11 through 19 also confirmed that short-circuiting occurred at a very low rate in each Example when the stretch rate was 150%, but the short-circuit rate was 0% in each Example when the stretch rate was 200% or higher. This is supposedly because a sufficiently long distance cannot be secured between conductive particles when the stretch rate is 150%, and the possibility of contact between the conduction particles 3 becomes higher accordingly. As can be seen from this, the first resin film 4 having the conductive particles 3 transferred and attached thereto is preferably uniaxially stretched at a higher stretch rate than at least 150% or to a greater length than 150% of the original length thereof.

Furthermore, it is apparent from Examples 11 through 19 that the particle density decreases in proportion to the stretch rate, regardless of the shape of the mold for the grooves 10 in the sheet 2. From these results, it is also apparent that the voids between the conductive particles 3 are formed by the stretching and depend on one direction.

As for the influence of the width W of the grooves 10 in the sheet 2, where the width W of the grooves 10 becomes greater as in Examples 12 and 13, the particle density becomes lower, and the proportion of joined particles becomes higher, compared with those in a case where the width W of the grooves 10 in the sheet 2 is equal to the particle size of the conductive particles 3 as in Example 11. As the width W of the grooves 10 becomes greater, the conductive particles 3 are easily transferred and attached to the first resin layer 5, and the efficiency of transfer of the conductive particles 3 becomes higher. Accordingly, the relative difference in the particle density between Example 12 and Example 13 becomes smaller. Also, as the width W of the grooves 10 becomes greater, misalignment in the arrangement of the conductive particles 3 becomes larger, and more conductive particles 3 are joined to one another. As a result, the proportion of joined particles becomes higher.

As for the influence of the depth D of the grooves 10 in the sheet 2, where the depth D of the grooves 10 becomes greater as in Examples 12 and 13, the transfer rate becomes higher as the resin of the first resin layer 5 reaches deep into the grooves 10, and accordingly, the particle density becomes higher, compared with that in a case where the depth D of the grooves 10 in the sheet 2 is equal to the particle size of the conductive particles 3 as in Example 11. Also, as the depth D of the grooves 10 becomes greater, the proportion of joined particles increases in proportion to the particle density. As for the rate of short-circuiting when the stretch rate is 150%, it is apparent from Example 14 that, where the grooves 10 in the sheet 2 are shallow, more particles are joined to one another, and the rate of short-circuiting becomes higher accordingly.

As for the influence of the distance S between particle rows in the sheet 2, where the distance S between particle rows becomes longer as in Examples 18 and 19, the particle density becomes lower, compared with that in a case where the distance S between particle rows in the sheet 2 is equal to the particle size of the conductive particles 3 as in Example 17. It is also apparent from Examples 17 and 18 that, as the inter-row distance S between particle rows in the sheet 2 becomes longer, the proportion of joined particles increases. However, it is apparent from Example 19 that, where the distance S between particle rows in the sheet 2 is equal to or longer than a predetermined length, no joined particles are observed when the stretch rate is 200% or higher.

Examples According to the Second Embodiment of the Present Invention

Next, where the stretch rate at the time of uniaxially stretching the first resin film 104 in Examples 21 through 26 and Comparative Examples 21 through 23 described below was varied from 150% to 200% to 300% to 450% to 700%, the particle densities, the proportions of joined particles, the variations in the particle density, and the rates of short-circuiting were measured under the same conditions as those in Examples 1 through 8 described above. The first resin film 104 in each of Examples 21 through 26 and Comparative Examples 21 through 23 was manufactured by the method for manufacturing the anisotropic conductive film 101 according to the second embodiment of the present invention. In each of Examples 21 through 26 and Comparative Examples 21 through 23, conductive particles 103 of 3 μm in particle size were used. The influence of the depth D of the grooves 110 in the sheet 102 was examined in Examples 21 through 23, and the influence of the shape of the protruding portions 112b of the guide body 112 and the like was examined in Examples 24 through 26. In Comparative Examples 21 through 23, the efficiency of filling the grooves 110 with the conductive particles 103 is not improved even if a guide body 112 according to another embodiment of the present invention is used together with the sheet 102 having the grooves 110 with a depth D that is equal to the particle size of the conductive particles 103.

In the guide body 112 used in Example 21, the height of the protruding portions 112b was 2 μm, the protrusion interval was 3.5 μm, the width W1 of the base portions of the clearance portions 112d on the squeegee side was 3.5 μm, and the width W2 of the tip portions was 4.5 μm. In the sheet 102 used in Example 21, the width W of the grooves 110 was 3.5 μm, the depth D was 1.0 μm, and the gap S between the grooves was 3.0 μm.

Example 22 was the same as Example 21, except that the depth D of the grooves 110 was 1.5 μm.

Example 23 was the same as Example 21, except that the depth D of the grooves 110 was 2.0 μm.

In the guide body 112 used in Example 24, the height of the protruding portions 112b was 1.5 μm, the protrusion interval was 3.5 μm, the width W1 of the base portions 112d1 of the clearance portions 112d of the guide body 112 was 3.5 μm, and the width W2 of the tip portions 112d2 was 4.5 μm. In the sheet 102 used in Example 24, the width W of the grooves 110 was 3.5 μm, the depth D was 1.5 μm, and the gap S between the grooves was 3.0 μm. Here, the "height" of a protruding portion 112b is the distance from the base portion 112b1 of the protruding portion 112b to the tip portion 112b2.

Example 25 was the same as Example 24, except that the height of the protruding portions 112b was 2.0 μm.

Example 26 was the same as Example 24, except that the height of the protruding portions 112b was 2.5 μm.

In the guide body 112 used in Comparative Example 21, the height of the protruding portions 112b was 2.0 μm, the protrusion interval was 3.0 μm, the width W1 of the base portions 112d1 of the clearance portions 112d was 3.0 μm, and the width W2 of the tip portions 112d2 was 4.0 μm. In the sheet 102 used in Comparative Example 21, the width W of the grooves 110 was 3.0 μm, the depth D was 3.0 μm, and the gap S between the grooves 110 was 3.0 μm.

In the guide body 112 used in Comparative Example 22, the height of the protruding portions 112b was 2.0 μm, the protrusion interval was 3.5 μm, the width W1 of the base portions 112d1 of the clearance portions 112d was 3.5 μm, and the width W2 of the tip portions 112d2 was 4.5 μm. In the sheet 102 used in Comparative Example 22, the width W of the grooves 110 was 3.5 μm, the depth D was 3.0 μm, and the gap S between the grooves 110 was 3.0 μm.

In the guide body 112 used in Comparative Example 23, the height of the protruding portions 112b was 2.0 μm, the protrusion interval was 4.5 μm, the width W1 of the base portions 112d1 of the clearance portions 112d was 4.5 μm, and the width W2 of the tip portions 112d2 was 5.5 μm. In the sheet 102 used in Comparative Example 23, the width W of the grooves 110 was 4.5 μm, the depth D was 3.0 μm, and the gap S between the grooves 110 was 3.0 μm.

The results of the measurement carried out on the particle densities, the proportions of joined particles, the variations in the particle density, and the rates of short-circuiting in a case where the stretch rate at the time of uniaxially stretching the first resin film 104 in Examples 21 through 26 and Comparative Examples 21 through 23 described above was varied from 150% to 200% to 300% to 450% to 700% are collectively shown in Table 3.

TABLE 3

|  |  | Example 21 | Example 22 | Example 23 | Example 24 | Example 25 | Example 26 | Comparative Example 21 | Comparative Example 22 | Comparative Example 23 |
|---|---|---|---|---|---|---|---|---|---|---|
| Shape of protruding portions of guide body (μm) | Height | 2 | 2 | 2 | 1.5 | 2 | 2.5 | 2 | 2 | 2 |
|  | Protrusion interval | 3.5 | 3.5 | 3.5 | 3.5 | 3.5 | 3.5 | 3 | 3.5 | 4.5 |
| Shape of clearance portions of guide body (μm) | Base width | 3.5 | 3.5 | 3.5 | 3.5 | 3.5 | 3.5 | 3 | 3.5 | 4.5 |
|  | Tip width | 4.5 | 4.5 | 4.5 | 4.5 | 4.5 | 4.5 | 4 | 4.5 | 5.5 |
| Arrangement status of conductive particles |  | arranged | arranged | arranged | arranged | arranged | arranged | arranged | arranged | arranged |
| Particle size of conductive particles (μm) |  | 3 | 3 | 3 | 3 | 3 | 3 | 3 | 3 | 3 |
| Shape of grooves | W(μm) | 3.5 | 3.5 | 3.5 | 3.5 | 3.5 | 3.5 | 3 | 3.5 | 4.5 |
|  | D(μm) | 1 | 1.5 | 2 | 1.5 | 1.5 | 1.5 | 3 | 3 | 3 |
|  | S(μm) | 3 | 3 | 3 | 3 | 3 | 3 | 3 | 3 | 3 |
| Particle density (number of particles/mm²) | Stretch (%) 150 | 25400 | 24800 | 24400 | 22400 | 24800 | 26900 | 22300 | 17300 | 16000 |
|  | 200 | 19900 | 19700 | 19200 | 18300 | 19700 | 20600 | 16200 | 15500 | 14600 |
|  | 300 | 13400 | 13000 | 12500 | 10900 | 13000 | 13600 | 12100 | 10300 | 9600 |
|  | 450 | 8900 | 8600 | 8500 | 6500 | 8600 | 9200 | 6800 | 6200 | 5900 |
|  | 700 | 5200 | 5100 | 4700 | 3700 | 5100 | 5900 | 4900 | 4500 | 4200 |
| Average proportion of joined particles (%) | Stretch (%) 150 | 2 | 3 | 2 | 9 | 3 | 3 | 18 | 12 | 10 |
|  | 200 | 0 | 0 | 0 | 2 | 0 | 0 | 7 | 5 | 4 |
|  | 300 | 0 | 0 | 0 | 0 | 0 | 0 | 1 | 1 | 0 |
|  | 450 | 0 | 0 | 0 | 0 | 0 | 0 | 0 | 0 | 0 |
|  | 700 | 0 | 0 | 0 | 0 | 0 | 0 | 0 | 0 | 0 |
| Variation σ in particle density | Stretch (%) 150 | 1.6 | 1.6 | 1.7 | 1.7 | 1.6 | 1.6 | 1.6 | 1.7 | 1.7 |
|  | 200 | 1.7 | 1.7 | 1.7 | 1.7 | 1.7 | 1.7 | 1.7 | 1.7 | 1.8 |
|  | 300 | 1.7 | 1.7 | 1.7 | 1.8 | 1.7 | 1.8 | 1.8 | 1.8 | 1.8 |
|  | 450 | 1.8 | 1.8 | 1.8 | 1.8 | 1.9 | 1.8 | 1.9 | 1.9 | 1.8 |
|  | 700 | 1.9 | 1.9 | 1.9 | 1.8 | 1.8 | 1.8 | 1.9 | 1.9 | 1.9 |
| Short-circuit rate (%) | Stretch (%) 150 | 2 | 3 | 3 | 3 | 3 | 2 | 5 | 6 | 5 |
|  | 200 | 0 | 0 | 0 | 0 | 0 | 0 | 2 | 2 | 1 |
|  | 300 | 0 | 0 | 0 | 0 | 0 | 0 | 2 | 1 | 0 |
|  | 450 | 0 | 0 | 0 | 0 | 0 | 0 | 0 | 0 | 0 |
|  | 700 | 0 | 0 | 0 | 0 | 0 | 0 | 0 | 0 | 0 |

As shown in Table 3, Examples 21 through 26 confirmed that the particle density and the proportion of joined particles decreased in proportion to the degree of stretching (stretch rate). This is supposedly because the conductive particles 103 were arranged beforehand in a predetermined pattern in the sheet 102, and the conductive particles 103 were effectively dispersed when the first resin film 104 having the conductive particles 103 transferred and attached thereto was uniaxially stretched. Meanwhile, Examples 21 through 26 also confirmed that the variation (σ) in the particle density was 2 or smaller, regardless of the stretch rate.

Examples 21 through 26 also confirmed that short-circuiting occurred at a very low rate in each Example when the stretch rate was 150%, but the short-circuit rate was 0% in each Example when the stretch rate was 200% or higher. This is supposedly because a sufficiently long distance cannot be secured between conductive particles when the stretch rate is 150%, and the possibility of contact between the conductive particles 103 becomes higher accordingly. As can be seen from this, the first resin film 104 having the conductive particles 103 transferred and attached thereto is preferably uniaxially stretched at a higher stretch rate than at least 150% or to a greater length than 150% of the original length thereof.

Furthermore, it is apparent from Examples 21 through 26 that the particle density decreases in proportion to the stretch rate, regardless of the shape of the mold for the grooves 110 in the sheet 102. From these results, it is also apparent that the voids between the conductive particles 103 are formed by the stretching and depend on one direction.

As for the influence of the depth D of the grooves 110 in the sheet 102, where the depth D of the grooves 110 becomes greater as in Examples 22 and 23, the particle density becomes lower, compared with that in a case where the depth D of the grooves 110 in the sheet 102 is ⅓ of the particle size of the conductive particles 103 as in Example 21. One of the possible reasons for this is that, when the depth D of the grooves 110 becomes greater, the degree of freedom of the conductive particles 103 to move during the period from the filling of the grooves 110 to the transfer of the conductive particles 103 becomes lower. In each of Examples 21 through 23, the depth D of the grooves 110 is smaller than the particle size of the conductive particles 103, and accordingly, increase in the depth D of the grooves 110 does not greatly affect the proportion of joined particles, the variation a in the particle density, and changes in the rate of short-circuiting.

Further, as for the influence of the shape of the protruding portions 112b of the guide body 112 and the like, where the height of the protruding portions 112b becomes greater as in Examples 24 through 26, the particle density increases, and the proportion of joined particles decreases. This is supposedly because extra stress is applied to the conductive particles 103 in a case where the protruding portions 112b of the guide body 112 have a great height. Therefore, the height of the protruding portions 112b of the guide body 112 is preferably about ⅔ of the particle size of the conductive particles 103 as in Example 25.

Meanwhile, in Comparative Examples 21 through 23 using anisotropic conductive films manufactured with the use of sheets having the grooves 110 with a depth D that was equal to the particle size of the conductive particles 103, the particle density decreased slightly, but joined particles and short-circuiting were observed even though the stretch rate was 200% or higher. This is supposedly because, even if the guide body 112 according to the second embodiment of the present invention is used together with a sheet 102 having grooves 110 with a depth D that is equal to the particle size of the conductive particles 103, extra conductive particles 103 cannot be removed with the guide body 112 due to the great depth of the grooves 110, and therefore, the efficiency of filling the grooves 110 in the sheet 102 is not improved.

Examples According to the Third Embodiment of the Present Invention

Next, where the stretch rate at the time of uniaxially stretching the first resin film 204 in Examples 31 through 39 described below was varied from 150% to 200% to 300% to 450% to 700%, the particle densities, the proportions of joined particles, the variations in the particle density, and the rates of short-circuiting were measured under the same conditions as those in Examples 1 through 8 described above. The first resin film 204 in each of Examples 31 through 39 was manufactured by filling a sheet 202 having electrodes 220 with conductive particles 203. In each of Examples 31 through 39, conductive particles 203 of 3 μm in particle size were used. The influence of the size of the electrodes 220 forming the grooves 210 in the sheet 202 or the width W of the grooves 210 was examined in Examples 31 through 33, the influence of the width of the electrodes 220 or the inter-row distance S between the particle rows 203a was examined in Examples 34 through 36, and the influence of the thickness of the electrodes 220 or the depth D of the grooves 210 was examined in Examples 37 through 39.

In the sheet 202 used in Example 31, each of the electrodes 220 was a 3.0-μm square in cross-section, or the width W and the depth D of the grooves 210 were 3.0 μm, and the interval S between the grooves 210 was 3.0 μm.

In the sheet 202 used in Example 32, each of the electrodes 220 was a 3.5-μm square in cross-section, or the width W and the depth D of the grooves 210 were 3.5 μm, and the interval S between the grooves 210 was 3.5 μm.

In the sheet 202 used in Example 33, each of the electrodes 220 was a 4.5-μm square in cross-section, or the width W and the depth D of the grooves 210 were 4.5 μm, and the interval S between the grooves 210 was 4.5 μm.

In the sheet 202 used in Example 34, each of the grooves 210 was a 3.5-μm square in cross-section, and the interval S between the grooves 210 was 3.0 μm.

In the sheet 202 used in Example 35, each of the grooves 210 was a 3.5-μm square in cross-section, and the interval S between the grooves 210 was 3.2 μm.

In the sheet 202 used in Example 36, each of the grooves 210 was a 3.5-μm square in cross-section, and the interval S between the grooves 210 was 4.5 μm.

In the sheet 202 used in Example 37, the width W of the grooves 210 was 3.5 μm, the depth D was 3.0 μm, and the interval S between the grooves 210 was 3.5 μm.

In the sheet 202 used in Example 38, the width W of the grooves 210 was 3.5 μm, the depth D was 3.2 μm, and interval S between the grooves 210 was 3.5 μm.

In the sheet 202 used in Example 39, the width W of the grooves 210 was 3.5 μm, the depth D was 4.5 μm, and the interval S between the grooves 210 was 3.5 μm.

The results of the measurement carried out on the particle densities, the proportions of joined particles, the variations in the particle density, and the rates of short-circuiting in a case where the stretch rate at the time of uniaxially stretching the first resin film 204 in Examples 31 through 39 described above was varied from 150% to 200% to 300% to 450% to 700% are collectively shown in Table 4.

TABLE 4

| | | | Example 31 | Example 32 | Example 33 | Example 34 | Example 35 | Example 36 | Example 37 | Example 38 | Example 39 |
|---|---|---|---|---|---|---|---|---|---|---|---|
| Arrangement status of conductive particles | | | arranged | arranged | arranged | arranged | arranged | arranged | arranged | arranged | arranged |
| Particle size of conductive particles (μm) | | | 3 | 3 | 3 | 3 | 3 | 3 | 3 | 3 | 3 |
| Shape of grooves | W(μm) | | 3 | 3.5 | 4.5 | 3.5 | 3.5 | 3.5 | 3.5 | 3.5 | 3.5 |
| | D(μm) | | 3 | 3.5 | 4.5 | 3.5 | 3.5 | 3.5 | 3 | 3.2 | 4.5 |
| | S(μm) | | 3 | 3.5 | 4.5 | 3 | 3.2 | 4.5 | 3.5 | 3.5 | 3.5 |
| Particle density (number of particles/mm²) | Stretch (%) | 150 | 27700 | 25100 | 19100 | 27600 | 26200 | 21900 | 15800 | 23700 | 25600 |
| | | 200 | 21700 | 18800 | 13900 | 20600 | 19400 | 16500 | 13100 | 18000 | 19000 |
| | | 300 | 14400 | 12200 | 9700 | 13700 | 12800 | 10900 | 7700 | 10800 | 12500 |
| | | 450 | 9300 | 8100 | 6200 | 9000 | 8600 | 7300 | 5800 | 7400 | 8300 |
| | | 700 | 6100 | 5900 | 4000 | 5800 | 5700 | 5900 | 4100 | 5300 | 6000 |
| Average proportion of joined particles (%) | Stretch (%) | 150 | 6 | 4 | 3 | 7 | 5 | 3 | 5 | 6 | 4 |
| | | 200 | 1 | 0 | 0 | 3 | 1 | 0 | 0 | 0 | 0 |
| | | 300 | 0 | 0 | 0 | 0 | 0 | 0 | 0 | 0 | 0 |
| | | 450 | 0 | 0 | 0 | 0 | 0 | 0 | 0 | 0 | 0 |
| | | 700 | 0 | 0 | 0 | 0 | 0 | 0 | 0 | 0 | 0 |
| Variation σ in particle density | Stretch (%) | 150 | 1.6 | 1.7 | 1.7 | 1.7 | 1.7 | 1.7 | 1.7 | 1.6 | 1.7 |
| | | 200 | 1.7 | 1.7 | 1.7 | 1.8 | 1.7 | 1.7 | 1.7 | 1.7 | 1.7 |
| | | 300 | 1.7 | 1.8 | 1.7 | 1.8 | 1.8 | 1.8 | 1.8 | 1.8 | 1.8 |
| | | 450 | 1.7 | 1.8 | 1.8 | 1.8 | 1.8 | 1.8 | 1.9 | 1.9 | 1.8 |
| | | 700 | 1.8 | 1.9 | 1.9 | 1.9 | 1.9 | 1.9 | 1.9 | 1.9 | 1.9 |
| Short-circuit rate (%) | Stretch (%) | 150 | 2 | 1 | 1 | 2 | 2 | 1 | 6 | 2 | 1 |
| | | 200 | 0 | 0 | 0 | 0 | 0 | 0 | 1 | 0 | 0 |
| | | 300 | 0 | 0 | 0 | 0 | 0 | 0 | 0 | 0 | 0 |
| | | 450 | 0 | 0 | 0 | 0 | 0 | 0 | 0 | 0 | 0 |
| | | 700 | 0 | 0 | 0 | 0 | 0 | 0 | 0 | 0 | 0 |

As shown in Table 4, Examples 31 through 39 confirmed that the particle density and the proportion of joined particles decreased in proportion to the degree of stretching (stretch rate). This is supposedly because the conductive particles 203 were arranged beforehand in a predetermined pattern in the sheet 202, and the conductive particles 203 were effectively dispersed when the first resin film 204 having the conductive particles 203 transferred and attached thereto was uniaxially stretched. In Examples 31 through 39, another reason for the decrease of joined particles is supposedly that the grooves 210 in the sheet 202 were filled with the conductive particles 203 by virtue of magnetic force, and extra stress was not applied to the conductive particles 203. Meanwhile, Examples 31 through 39 also confirmed that the variation (σ) in the particle density was 2 or smaller, regardless of the stretch rate.

Examples 31 through 39 also confirmed that short-circuiting occurred at a very low rate in each Example when the stretch rate was 150%, but the short-circuit rate was 0% in each Example when the stretch rate was 200% or higher. This is supposedly because a sufficiently long distance cannot be secured between conductive particles when the stretch rate is 150%, and the possibility of contact between the conductive particles 203 becomes higher accordingly. As can be seen from this, the first resin film 204 having the conductive particles 203 transferred and attached thereto is preferably uniaxially stretched at a higher stretch rate than at least 150% or to a greater length than 150% of the original length thereof.

Furthermore, it is apparent from Examples 31 through 39 that the particle density decreases in proportion to the stretch rate, regardless of the shape of the mold for the grooves 210 in the sheet 202. From these results, it is also apparent that the voids between the conductive particles 203 are formed by the stretching and depend on one direction.

As can be seen from this, the first resin film 204 having the conductive particles 203 transferred and attached thereto is preferably uniaxially stretched at a higher stretch rate than at least 150% or to a greater length than 150% of the original length thereof. In a case where the stretch rate is 200% as in Examples 31 and 34, the particle density is higher than in any other cases. This is supposedly because, where the interval S between the grooves 210 is equal to the particle size of the conductive particles 203, there remains a possibility of contact between the conductive particles 203.

As for the influence of the size of the electrodes 220 or the width W of the grooves 210, the particle density decreases as the cross-section of each electrode 220 becomes larger. In Example 31, joined particles were observed even though the stretch rate was 200%. This might affect the transfer in a case where the cross-section of each electrode 220 is the same as that of each conductive particle 203. As can be seen from this, the width W of the grooves 210 is preferably greater than the particle size of the conductive particles 203.

As for the influence of the width of the electrodes 220 or the inter-row distance S between the particle rows 203a, it is apparent from Example 32 and Examples 34 through 36 that both the particle density and the proportion of joined particles decrease as the inter-row distance S between the particle rows 203a becomes longer. As can be seen from this, the inter-row distance S between the particle rows 203a is preferably greater than at least the particle size of the conductive particles 203.

As for the influence of the thickness of the electrodes 220 or the depth D of the grooves 210, it is apparent from Example 32 and Examples 37 through 39 that the particle density increases as the thickness of the electrodes 220 or the depth D of the grooves 210 becomes greater. This is supposedly because, where the grooves 210 are deep, the resin of the first resin layer 205 reaches deep into the grooves 210, and accordingly, the transfer rate becomes higher. As described above, in a case where the depth D of the grooves 210 is substantially equal to the particle size of the conductive particles 203, the possibility that the surfaces of the conductive particles 203 are damaged when extra conductive particles 203 are removed with the squeegee 212 after the grooves 210 are filled with the conductive particles 203 becomes higher. Therefore, the depth D of the grooves 210 is preferably greater than at least the particle size of the conductive particles 203.

REFERENCE SIGNS LIST 1, 101, 201 Anisotropic conductive film
2, 102, 202 Sheet
3, 103, 203 Conductive particle
3a, 103a, 203a Particle row
4, 104, 204 First resin film
5, 105, 205 First resin layer
5a, 5b Portion
5c, 5d Cliff-like portion
6 Base film
7 Second resin film
8 Second resin layer
9 Base film
10 Groove
12, 212 Squeegee
13 Inclined surface
14, 114, 214 Convex portion
15, 115, 215 Concave portion
16 Clearance
50 Connected structure
52 Electronic component
54 Substrate
56 Bump
58 Electrode
102a Interval portion
112 Guide body
112a Contact surface
112b Protruding portion
112b1 Base portion
112b2 Tip portion
112b3 Tapered surface
112c Sidewall portion
112d Clearance portion
112d1 Base portion
112d2 Tip portion
220 Electrode

The invention claimed is:

1. An anisotropic conductive film comprising:
a resin layer; and
a plurality of conductive particles in contact with the resin layer,
wherein the conductive particles form a particle row in which particle intervals are arranged with a predetermined regularity in a first direction on the resin layer,
wherein a plurality of the particle rows are arranged in a second direction orthogonal to the first direction,
wherein the conductive particles in each particle row are arranged randomly within the particle row in the second direction, and
wherein each conductive particle in each particle row varies in the second direction relative to other conductive particles in the particle row.

2. A connected structure comprising the anisotropic conductive film according to claim 1 connected to an electronic component.

3. The anisotropic conductive film according to claim 1, wherein the resin layer is formed with at least two layer structures, comprising at least a first resin layer forming a layer, and a second resin layer laminated on the first resin layer, and
wherein the conductive particles are in contact with at least the first resin layer.

4. The anisotropic conductive film according to claim 1, wherein a width of the particle rows in the second direction is greater than 1 and less than 2.5 times a particle size of the conductive particles.

5. The anisotropic conductive film according to claim 1, wherein a width of the particle rows in the second direction is greater than 1 and less than 2.5 times a particle size of the conductive particles and is defined by two edges, and an edge portion of each conductive particle in at least one particle row is in contact with either of the two edges.

6. The anisotropic conductive film according to claim 1, wherein a distance between conductive particles in the particle rows in the first direction is equal.

7. The anisotropic conductive film according to claim 1, wherein the second direction is oblique to the longitudinal direction of the film.

8. A method for manufacturing a connected structure including the anisotropic conductive film according to claim 1, the method comprising:
connecting an electronic component to the connected structure using the anisotropic film.

9. A connection structure comprising:
a plurality of electronic components; and
an anisotropic conductive film connecting the plurality of electronic components together, the anisotropic conductive film comprising:
a resin layer; and
a plurality of conductive particles in contact with the resin layer,
wherein the conductive particles form a particle row in which particle intervals are arranged with a predetermined regularity in a first direction on the resin layer,
wherein a plurality of the particle rows are arranged in a second direction orthogonal to the first direction,
wherein the conductive particles in each particle row are arranged randomly within the particle row in the second direction, and
wherein each conductive particle in each particle row varies in the second direction relative to other conductive particles in the particle row.

10. The connection structure according to claim 9, wherein
the resin layer has at least two-layer structure including a first resin layer constituting one layer, and a second resin layer laminated on the first resin layer, and
the conductive particles are in contact with at least the first resin layer.

11. A method for manufacturing connecting structure comprising
a step of connecting electronic components to each other via an anisotropic conductive film,
the anisotropic conductive film comprising:
a resin layer; and
a plurality of conductive particles in contact with the resin layer,
wherein the conductive particles form a particle row in which particle intervals are arranged with a predetermined regularity in a first direction on the resin layer,
wherein a plurality of the particle rows are arranged in a second direction orthogonal to the first direction,
wherein the conductive particles in each particle row are arranged randomly within the particle row in the second direction, and wherein each conductive particle in each particle row varies in the second direction relative to other conductive particles in the particle row.

12. The method for of manufacturing a connection structure according to claim 11, wherein
the resin layer has at least two-layer structure including a first resin layer constituting one layer, and a second resin layer laminated on the first resin layer, and
the conductive particles are in contact with at least the first resin layer.

* * * * *